United States Patent
Watson et al.

(10) Patent No.: US 10,656,052 B2
(45) Date of Patent: May 19, 2020

(54) TESTING ENVIRONMENT FOR AUTONOMOUS VEHICLES

(71) Applicant: UATC, LLC, San Francisco, CA (US)

(72) Inventors: Adam Watson, Ford City, PA (US); Johnathan Rearick, Ford City, PA (US); Anthony Bembic, Pittsburgh, PA (US)

(73) Assignee: UATC, LLC, San Francisco, CA (US)

( * ) Notice: Subject to any disclaimer, the term of this patent is extended or adjusted under 35 U.S.C. 154(b) by 105 days.

(21) Appl. No.: 15/689,196

(22) Filed: Aug. 29, 2017

(65) Prior Publication Data

US 2019/0064036 A1 Feb. 28, 2019

(51) Int. Cl.
| | |
|---|---|
| *B65G 13/02* | (2006.01) |
| *B65G 13/00* | (2006.01) |
| *G01M 17/007* | (2006.01) |
| *G01M 17/03* | (2006.01) |
| *G01R 31/00* | (2006.01) |
| *B61B 13/02* | (2006.01) |
| *B61B 13/04* | (2006.01) |
| *B61B 13/06* | (2006.01) |
| *B65G 1/02* | (2006.01) |
| *B66C 11/06* | (2006.01) |
| *G05D 1/08* | (2006.01) |
| *B65G 17/00* | (2006.01) |
| *B65G 23/00* | (2006.01) |
| *B65G 39/00* | (2006.01) |
| *B65G 41/00* | (2006.01) |

(52) U.S. Cl.
CPC ......... *G01M 17/0074* (2013.01); *B61B 13/02* (2013.01); *B61B 13/04* (2013.01); *B61B 13/06* (2013.01); *B65G 1/02* (2013.01); *B65G 1/023* (2013.01); *B65G 13/02* (2013.01); *B66C 11/06* (2013.01); *G01M 17/03* (2013.01); *G01R 31/006* (2013.01); *B65G 13/00* (2013.01); *B65G 17/00* (2013.01); *B65G 23/00* (2013.01); *B65G 39/00* (2013.01); *B65G 41/00* (2013.01); *G05D 1/0891* (2013.01); *G05D 2201/0213* (2013.01)

(58) Field of Classification Search
CPC .......................... G01M 17/0074; B66C 11/06
See application file for complete search history.

(56) References Cited

U.S. PATENT DOCUMENTS

| | | | | |
|---|---|---|---|---|
| 4,318,346 | A * | 3/1982 | Sessum ..................... | B66C 9/14 105/153 |
| 6,050,198 | A * | 4/2000 | Gersemsky ............... | B66C 9/14 105/30 |
| 2002/0185031 | A1* | 12/2002 | Greeley .................... | B61B 3/00 104/93 |

(Continued)

*Primary Examiner* — Eric S. McCall
*Assistant Examiner* — Timothy P Graves
(74) *Attorney, Agent, or Firm* — Dority & Manning, PA

(57) ABSTRACT

A trolley assembly for overhead track testing is provided. In one example embodiment, a trolley assembly includes an idle roller that rotates about a first axis, a first top roller coupled to a first end of the idle roller via a first trolley upright support, and a second top roller coupled to a second end of the idle roller via a second trolley upright support. The trolley assembly includes a cantilever coupled to the idle roller. The trolley assembly includes a driveshaft coupled to a first end of the cantilever. The trolley assembly includes at least one motor coupled to the drive shaft.

14 Claims, 22 Drawing Sheets

(56) References Cited

U.S. PATENT DOCUMENTS

2011/0220447 A1* 9/2011 Schroder .................. B60L 5/38
                                                    191/50
2015/0307112 A1* 10/2015 Liu ........................... B61B 3/02
                                                    104/23.1

* cited by examiner

TESTING ENVIRONMENT FOR AUTONOMOUS VEHICLES

FIELD

The present disclosure relates generally to a trolley assembly for traversing an overhead track.

BACKGROUND

An autonomous vehicle is a vehicle that is capable of sensing its environment and navigating with little to no human input. Operational improvements for autonomous vehicles can sometimes be identified when testing an autonomous vehicle in a testing environment. Testing environments can incorporate one or more test objects to simulate real objects (e.g., people, vehicles, bicycles, etc.) that an autonomous vehicle may encounter in live operation and to test a reaction of the autonomous vehicle to such test objects. There is a need to position such test objects within an autonomous vehicle testing environment in a manner that affords precision and repeatability.

SUMMARY

Aspects and advantages of the present disclosure will be set forth in part in the following description, or may be learned from the description, or may be learned through practice of the embodiments.

One example aspect of the present disclosure is directed to a trolley assembly. The trolley assembly includes an idle roller that rotates about a first axis in a first plane. The trolley assembly includes a first top roller coupled to a first end of the idle roller via a first trolley upright support, wherein the first top roller rotates about a second axis in the first plane, the second axis offset at a first angle with respect to the first axis. The trolley assembly includes a second top roller coupled to a second end of the idle roller via a second trolley upright support, wherein the second top roller rotates about a third axis in the first plane, the third axis offset at a second angle with respect to the first axis. The trolley assembly includes a cantilever coupled to the idle roller, wherein the cantilever rotates about the first axis. The trolley assembly includes a driveshaft coupled to a second end of the cantilever, wherein the driveshaft rotates about a fourth axis parallel to the first axis, and the fourth axis rotates about the first axis. The trolley assembly includes at least one motor coupled to the drive shaft, wherein the motor causes the driveshaft to rotate about the fourth axis.

Another example aspect of the present disclosure is directed to a method of traversing an overhead track with a trolley assembly. The method includes affixing the trolley assembly to an overhead track, the trolley assembly including a cantilever and a driveshaft coupled to a second end of the cantilever. The method includes adding a force to a first end of the cantilever so that the cantilever rotates about a first axis to a first position, causing the driveshaft coupled to the second end of the cantilever to contact the overhead track, wherein the first axis is positioned between the first and second ends of the cantilever, and the first axis is orthogonal to a traversing direction of the trolley assembly along the overhead track. The method includes rotating the driveshaft about a second axis parallel to the first axis, wherein rotating the driveshaft while the driveshaft is in contact with the overhead track causes the trolley assembly to traverse the overhead track.

Yet another example aspect of the present disclosure is directed to a trolley assembly. The trolley assembly includes an idle roller comprising a generally cylindrical body and configured to contact an overhead track at a first point on an underside of the overhead track to affix the trolley assembly to the overhead track. The trolley assembly includes a first top roller comprising a generally cylindrical body and configured to contact an overhead track at a second point on a topside of the overhead track to affix the trolley assembly to the overhead track. The trolley assembly includes a second top roller comprising a generally cylindrical body and configured to contact an overhead track at a third point on the topside of the overhead track to affix the trolley assembly to the overhead track, wherein the first and second top rollers are configured to define a spacing in between the first and second top rollers on the topside of the overhead track through which one or more supports of the overhead track pass as the trolley assembly traverses the overhead track.

Other example aspects of the present disclosure are directed to systems, methods, vehicles, apparatuses, tangible, non-transitory computer-readable media, and memory devices for a trolley assembly.

These and other features, aspects, and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which make reference to the appended figures, in which.

DETAILED DESCRIPTION

Figure 1:
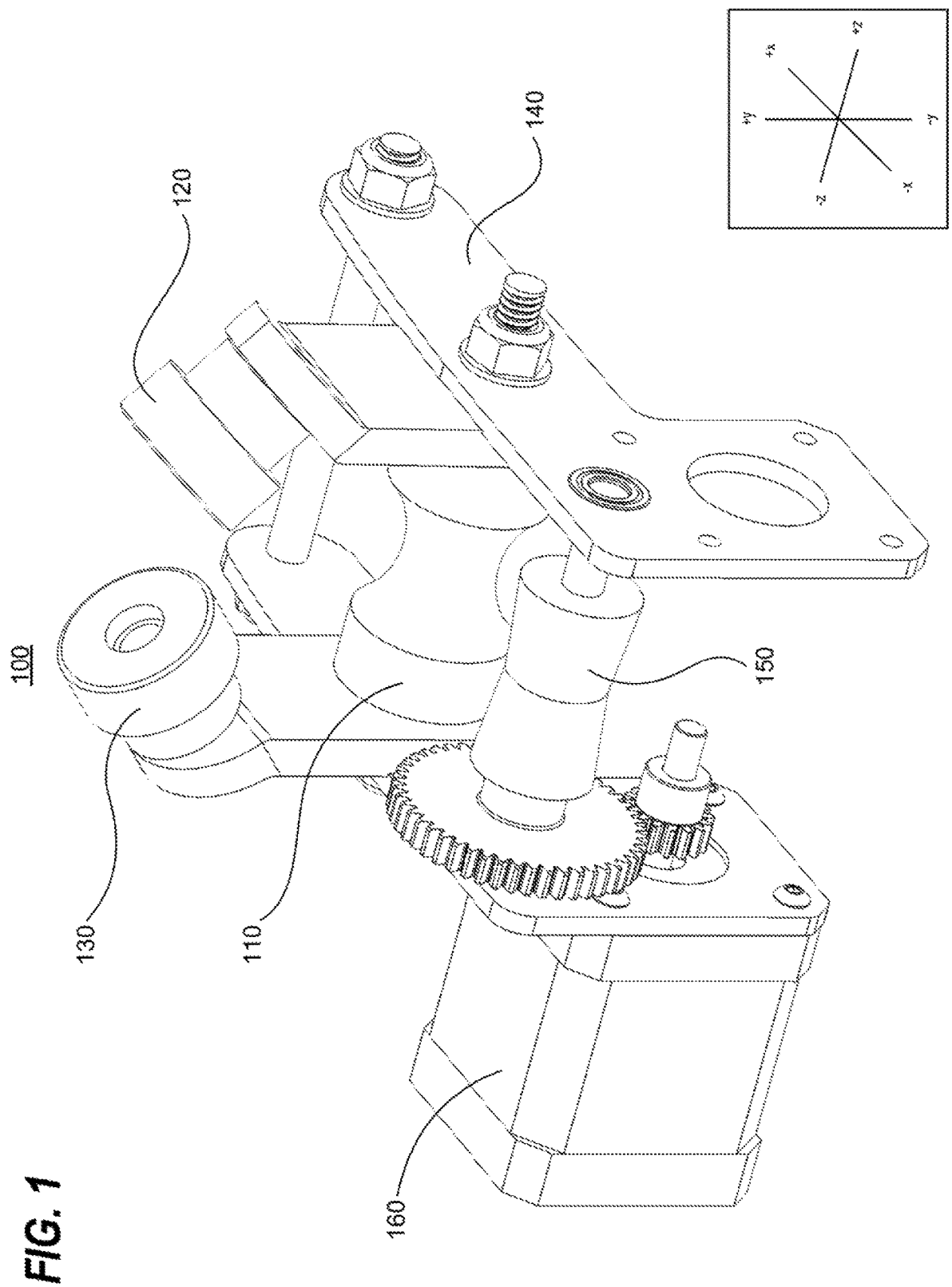
FIG. 1 depicts a trolley assembly, according to example embodiments of the present disclosure.

Example aspects of the present disclosure are directed to a trolley assembly. More particularly, the trolley assembly can traverse an overhead track that is supported by one or more supports. For example, when an autonomous vehicle is operating in a testing environment, a test object (e.g., a test mannequin, serving as a safety driver, passenger, bystander, etc.; a test bicycle; a test vehicle; or other moveable object)

can be maneuvered to travel any one of several paths near and around the autonomous vehicle. Each path of the test object can be represented by an overhead track. The overhead track can be, for example, a generally cylindrical pipe that extends along a direction of a path and that is positioned above the autonomous vehicle via one or more overhead supports. A trolley assembly can be attached to the overhead track and traverse the track to represent a position and motion of the test object along the specific path represented by the overhead track. For example, when the test object is a test mannequin, the test mannequin (e.g., a test dummy) can be attached to the trolley assembly while the trolley assembly traverses the overhead track, and one or more sensor(s) on-board the autonomous vehicle can detect the test dummy as representing the individual. The trolley assembly includes an overall design and specific mechanical features (e.g., rollers, a cantilever, motor(s), etc.) that can be maneuvered along an overhead track while avoiding overhead supports for the track, thus providing improved operation with a variety of different test track configurations.

More particularly, a trolley assembly can include one or more roller(s), a cantilever, a driveshaft, and one or more motors. The roller(s) can be configured to contact an overhead track ("overhead track") and affix the trolley assembly to the track. The cantilever can be configured to support a test dummy hanging from the trolley assembly, and enable the driveshaft to contact the overhead track. The motor can be configured to rotate the driveshaft about an axis and cause the trolley assembly to traverse the overhead track in a direction corresponding to the rotation of the driveshaft.

The trolley assembly will now be described in further detail. For purposes of the description, the overhead track is assumed as a cylinder centered on the x-axis in three-dimensional Euclidean space (x, y, z), and extending in either direction along the x-axis. The overhead track is supported at periodic intervals by supports extending in the +y direction, and the force of gravity acts in the −y direction.

In some implementations, one or more sections of the overhead track can extend at an angle with respect to one or more other sections of the overhead track. For example, the overhead track can include turns in the left, right, up, or down directions (e.g., +/−y and/or +/−z). For purposes of the description, in these cases the coordinate system can be rotated to align each segment along the x-axis while the direction of the supports and the direction of gravity remain fixed.

The roller(s) of the trolley assembly can include an idle roller, first top roller, and second top roller. In some implementations, the idle roller, first top roller, and second top roller can each comprise a generally cylindrical body. In some implementations, the generally cylindrical body can include at least a portion formed with a concave shape. In some implementations, the idle roller, first top roller, and second top roller can be configured to each contact the overhead track at different points to affix the trolley assembly to the track. For example, the idle roller can contact an underside of the overhead track (e.g., in the −y domain), and the first and second top rollers can contact a topside of the overhead track (e.g., in the +y domain). In particular, the first and second top rollers can be positioned to define a spacing in between the first and second top rollers on the topside of the overhead track for the supports extending in the +y direction. For example, the first top roller can contact the overhead track at a point in the +y and +z domain, and the second top roller can contact the overhead track at a point in the +y and −z domain. The first top roller can be coupled to a first end of the idle roller via a first trolley upright support, and the second top roller can be coupled to a second end of the idle roller via a second trolley upright support. In this way, a force in the −y direction (e.g., gravity) on the trolley assembly is zeroed by a normal force in the +y direction exerted on the first and second top rollers by the overhead track.

The idle roller, first top roller, and second top roller can rotate about a first axis, second axis, and third axis, respectively. In some implementations, the first, second, and third axes are orthogonal to the x-axis. For example, the first axis can be in the −y domain, the second and third axes can be in the +y domain, and each of the axes can extend in the +z and −z direction. In particular, the first, second, and third axes can belong to a first plane that is parallel to the y-axis and perpendicular to the x-axis. The first and second axis can intersect at a first angle in the first plane, and the first and third axis can intersect at a second angle in the first plane. For example, first axis can have a slope of zero in the +z direction, the second axis can have a positive slope in the +z direction, and the third axis can have a negative slope in the +z direction. The idle roller, first top roller, and second top roller can each rotate about its respective axis as the trolley assembly traverses the overhead track in the +x or −x direction.

The cantilever of the trolley assembly can include a trolley side support coupled to the idle roller and extending along the x-axis. In some implementations, the trolley side support can itself function as the cantilever. In some implementations, the cantilever can include a first and second trolley side support coupled to a first and second end of the idle roller, respectively. For example, a first trolley side support of the cantilever can be coupled to the first trolley upright support, and the second trolley side support can be coupled to the second trolley upright support. In some implementations, first trolley side support can rotate about the first axis at the first end of the idle roller, and the second trolley side support can rotate about the first axis at the second end of the idle roller. In some implementations, the first and second trolley side supports can be coupled to each other so that they rotate together about the first axis. For example, the first and second trolley side support can be coupled by a cantilever support that is parallel to the first axis and extends between the first trolley side support and the second trolley side support. In some implementations, the first and second trolley side supports can be coupled by a first cantilever support on a first end of the cantilever, and a second cantilever support on a second end of the cantilever.

The cantilever of the trolley assembly can be configured to support a test dummy hanging from the trolley assembly, and enable the driveshaft to contact the overhead track. For example, the first cantilever support can include a hook on which to hang a test object (e.g., a test dummy), and the second cantilever support can include a housing for the driveshaft and motor. When a test object is detached from the first cantilever support, the weight of the driveshaft and motor exerts a force in the −y direction on the second end of the cantilever. This force causes the cantilever to rotate about the first axis such that the second end of the cantilever moves in a −y direction to a first cantilever position and the first end of the cantilever moves in a +y direction. When a test object is attached to the first cantilever support, the weight of the test object exerts a force in the −y direction greater than the force exerted by the driveshaft and motor at the second end. This force causes the cantilever to rotate about the first axis such that the second end of the cantilever moves in a +y direction to a second cantilever position and causes a driveshaft positioned in a driveshaft-housing to contact the overhead track.

The driveshaft of the trolley assembly can be positioned in a driveshaft-housing at the second end of the cantilever, and configured to rotate about a fourth axis. When the driveshaft is in contact with the overhead track, a rotation of the driveshaft about the fourth axis causes the trolley assembly to traverse the overhead track. The trolley assembly traverses the overhead track in a direction that corresponds to a direction of the driveshaft rotation. In some implementations, the fourth axis is parallel to the first axis. When the cantilever rotates about the first axis between the first cantilever position and second cantilever position, the fourth axis also rotates about the first axis between a first and second position, respectively. For example, when the cantilever is in the first cantilever position, the fourth axis is a first distance from the overhead track such that the driveshaft is not in contact with the overhead track. In this case, a rotation of the driveshaft about the fourth axis does not cause the trolley assembly to traverse the overhead track. When the cantilever is in the second cantilever position, the fourth axis is a second distance from the overhead track such that the driveshaft is in contact with the overhead track. In this case, a rotation of the driveshaft about the fourth axis causes the trolley assembly to traverse the overhead track.

The motor of the trolley assembly can be configured to rotate the driveshaft about the fourth axis and cause the trolley assembly to traverse the overhead track in a direction corresponding to the rotation. In some implementations, the motor can be housed at the second end of the cantilever, near the driveshaft. In some implementations, the trolley assembly can include more than one motor. For example, a first motor can be coupled to a first end of the driveshaft, and a second motor can be coupled to a second end of the driveshaft.

The systems and methods described herein can provide a number of technical effects and benefits. For instance, the trolley assembly and associated test object(s) can enable accurate representation of a position and motion of an individual or other test object along a predetermined path. In particular, the trolley assembly enables precise representation along a path proximal to an autonomous vehicle. In this way, a perception and reaction of the autonomous vehicle to the individual or object can be tested in different scenarios and conditions to ensure safe operation in the real world. Additionally, the trolley assembly can be configured to define a spacing such that overhead supports for the overhead track can be avoided while the trolley assembly traverses a track. This simplifies positioning and adjustment of the overhead tracks so that a variety of track configurations can be tested with ease. Furthermore, a single track configuration can be easily recreated, as needed. For example, a tester can recreate repeatable testing scenarios for the same AV or different AVs (e.g., different models, different software builds, etc.).

EXAMPLE EMBODIMENTS

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

With reference now to the FIGS., example embodiments of the present disclosure will be discussed in further detail. FIG. 1 depicts an example trolley assembly 100, according to example embodiments of the present disclosure. The trolley assembly 100 can include a plurality of trolley assembly rollers (e.g., an idle roller 110, first top roller 120, and second top roller 130) as well as a cantilever 140, driveshaft 150, and motor 160.

Figure 2A:
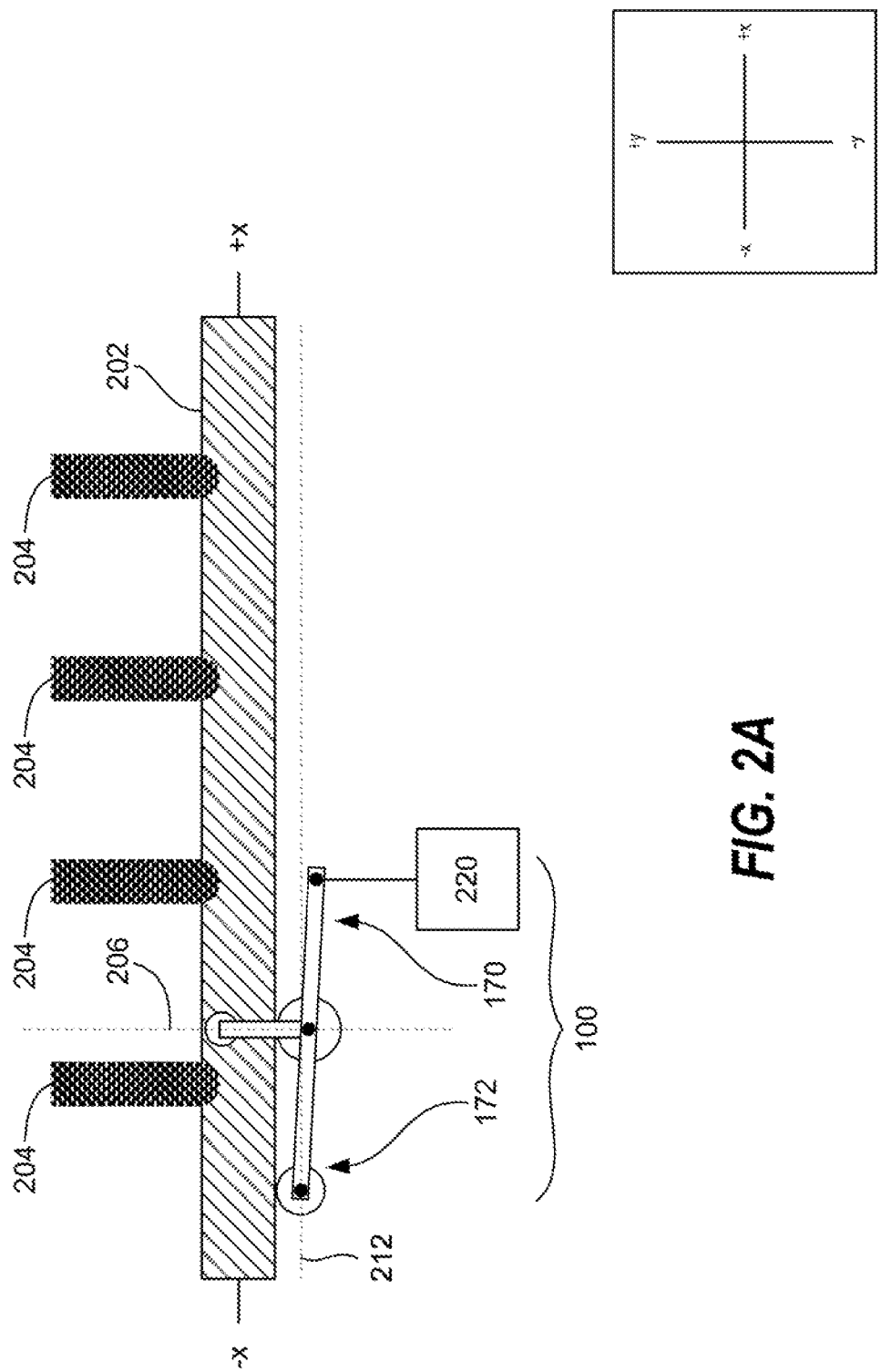
FIGS. 2A-2D depict a trolley assembly affixed to an overhead track, according to example embodiments of the present disclosure.

FIGS. 2A-2D depict a trolley assembly affixed to an overhead track, according to example embodiments of the present disclosure. As shown in FIG. 2A-2D, the overhead track 202 can be a cylinder centered on the x-axis in three-dimensional Euclidean space (x, y, z), and extending in either direction along the x-axis. As shown in FIG. 2A, the trolley assembly 100 is affixed to the overhead track 202 at a first position 206. The overhead track 202 can be, for example, a generally cylindrical pipe or other suitable material that extends along a direction of a path. The overhead track 202 is supported by one or more support(s) 204. The overhead track 202 can be configured to represent any one of several paths of a test object 220. Test object 220 can be a test mannequin (e.g., a test dummy) serving as a safety driver, passenger, bystander, etc.; a test bicycle, a test vehicle; or other moveable object. The test object 220 can be affixed to the trolley assembly 100 so that the test object 220 travels along the one of several paths represented by the overhead track 202 as the trolley assembly 100 traverses the overhead track 202.

Figure 2B:
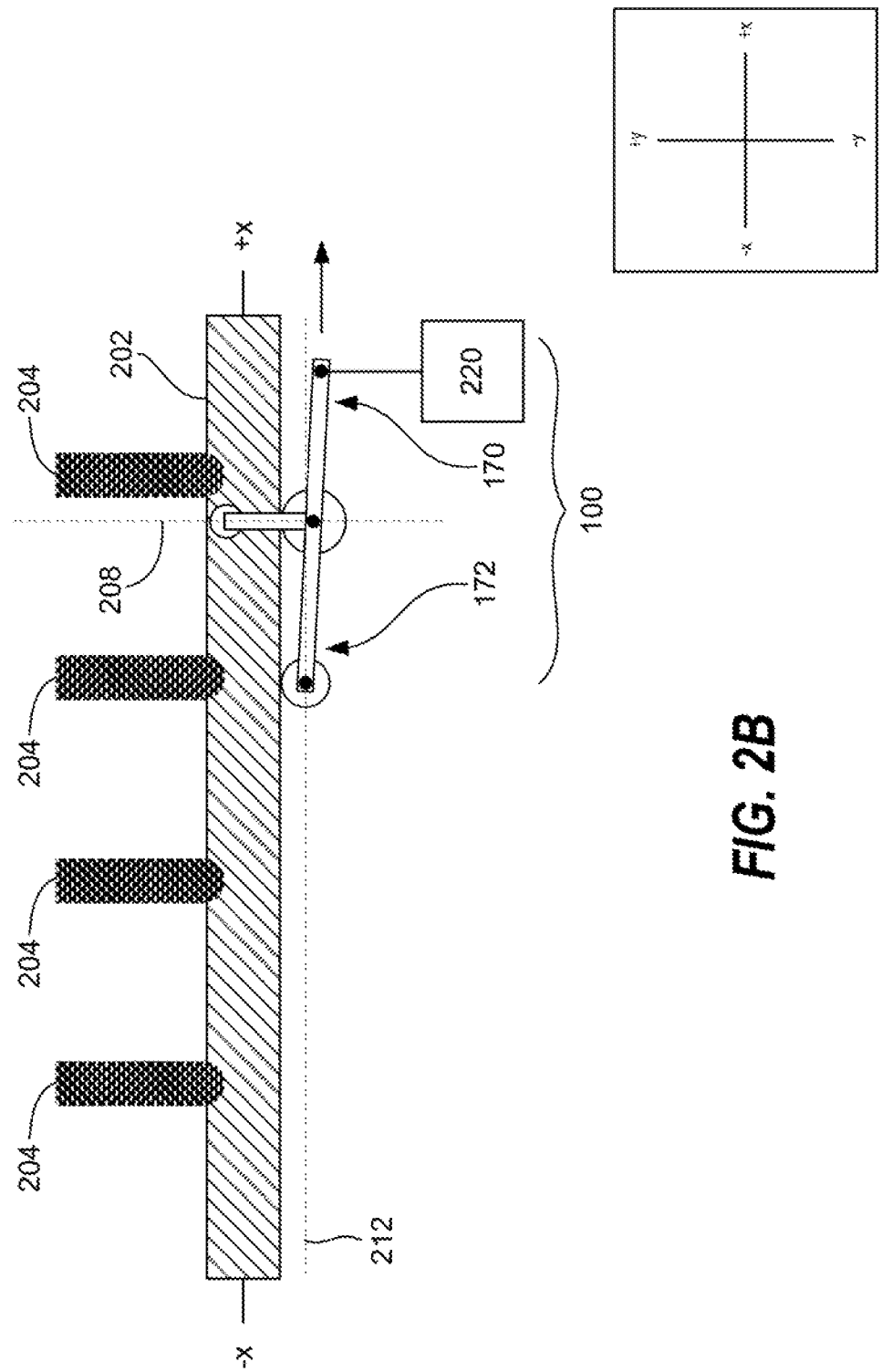

As shown in FIGS. 2A and 2B, the trolley assembly 100 can traverse the overhead track 202, for example, in the +x direction from first position 206 to a second position 208. The trolley assembly 100 can be maneuvered along the overhead track 202 while avoiding the supports 204. First position 206 and second position 208 are provided as examples, although trolley assembly 100 can be configured to selectively maneuver into numerous other positions along the entirety of overhead track 202.

Figure 2C:
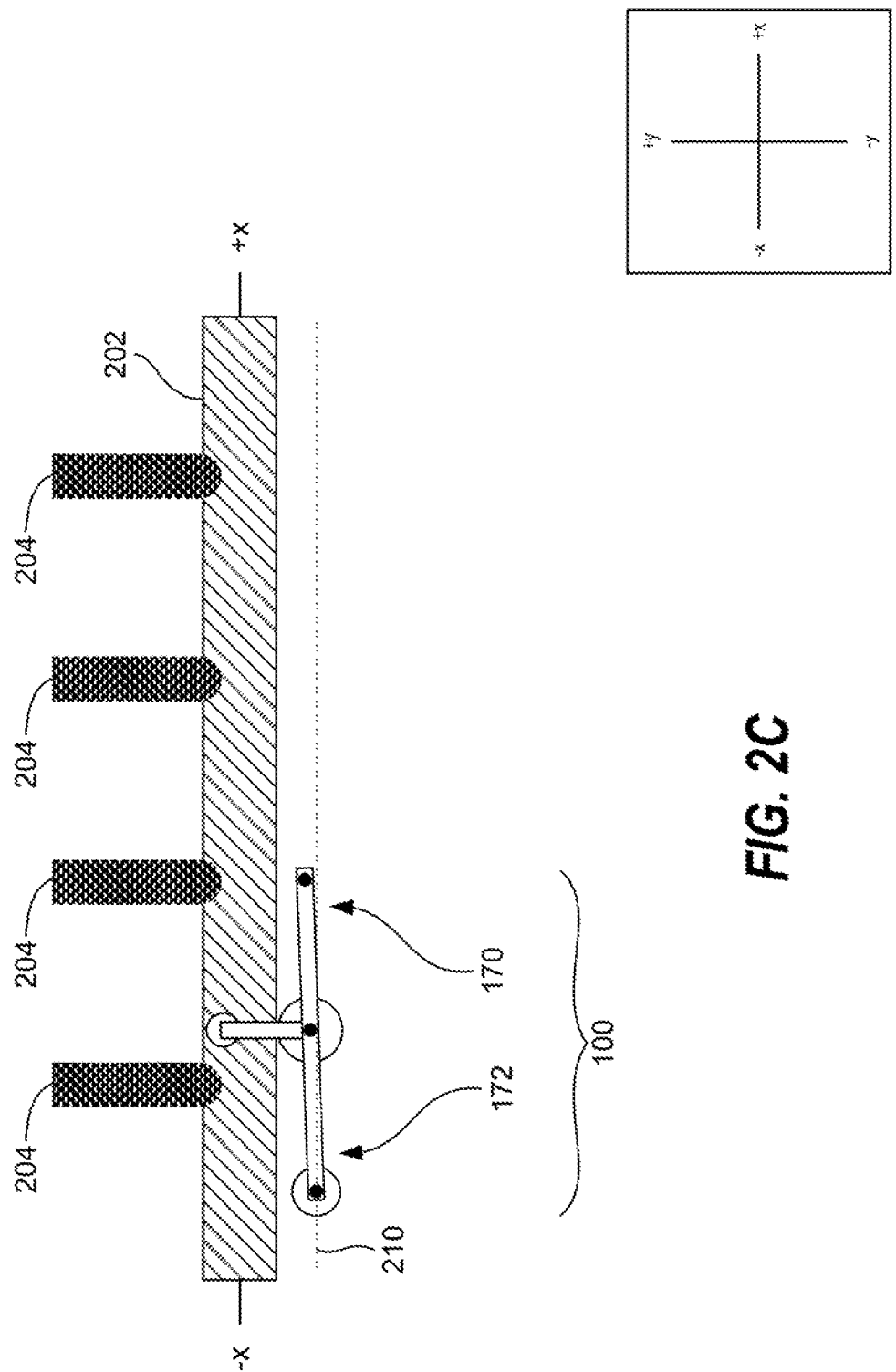

FIGS. 2A and 2C collectively depict how the cantilever 140 of trolley assembly 100 can shift between a first cantilever position 210 as shown in FIG. 2C and a second cantilever position 220 as shown in FIG. 2A. More particularly, cantilever 140 can be characterized by a first end 170 and a second end 172 generally opposite the first end 170. The cantilever 140 of the trolley assembly 100 can be configured to support the test object 220 from the first end 170 of the trolley assembly 100. For example, a connector 174 can connect first end 170 of cantilever 140 to test object 220 (e.g., a test dummy). In some implementations, the second end 172 of the cantilever 140 can include housings for a driveshaft and motor (e.g., driveshaft 150 and motor 160 of FIG. 1).

As shown in FIG. 2C, when the test object 220 is detached from the first end 170 of cantilever 140, the weight of the second end 172 (e.g., due to components such as the driveshaft and motor) exerts a force in the −y direction on the second end 172 of the cantilever 140. This force causes the cantilever 140 to rotate (e.g., about a first axis 112 depicted in FIG. 2D) such that the second end 172 of the cantilever 140 moves in a −y direction to the first cantilever position 210 and the first end 170 of the cantilever 140 moves in a +y direction.

As shown in FIG. 2A, when the test object 220 is attached to the first end 170 of cantilever 140, the weight of the test object 220 exerts a force in the −y direction greater than the force exerted by the trolley assembly components (e.g., driveshaft 150 and motor 160) at the second end 172 of the cantilever 140. This force causes the cantilever 140 to rotate about the first axis (e.g., first axis 112 of FIG. 2D) such that the second end 172 of the cantilever 140 moves in a +y direction to a second cantilever position 212 and causes the driveshaft (e.g., driveshaft 150 of FIG. 1) positioned at the second end 172 to contact the overhead track 202.

Figure 2D:
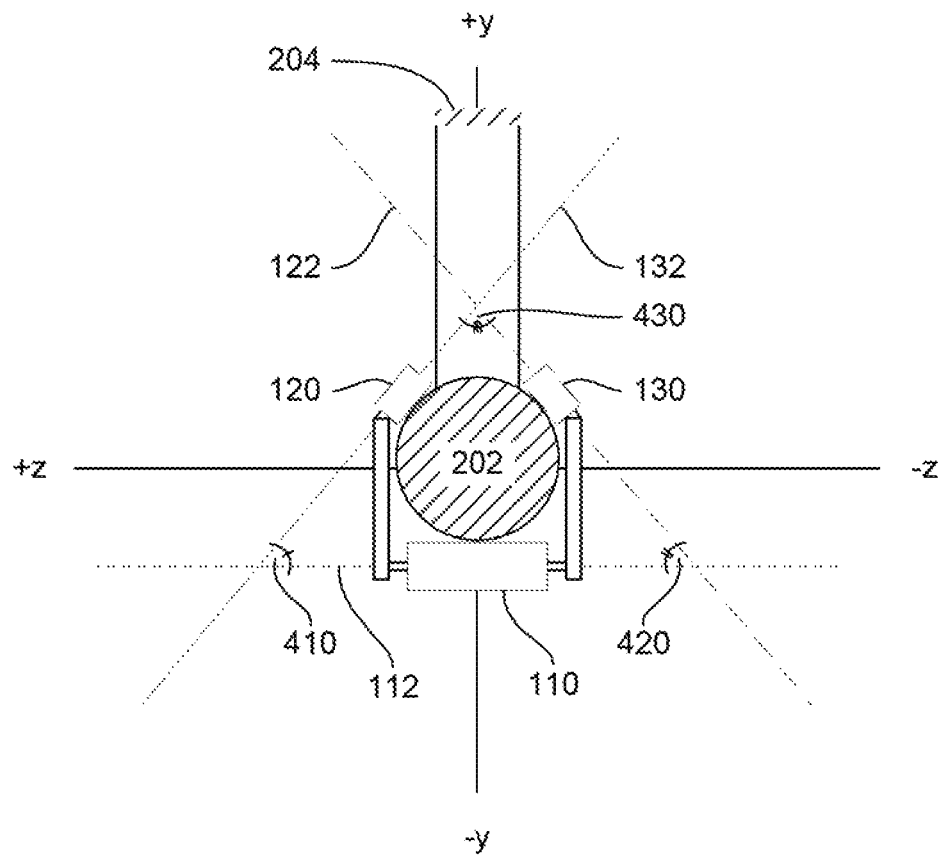

FIG. 2D depicts positional aspects of the plurality of trolley assembly rollers (e.g., idle roller 110, first top roller 120 and second top roller 130). For example, as shown in FIG. 2D, the idle roller 110 can contact an underside of the overhead track 202 (e.g., in the −y domain), and the first and second top rollers 120, 130 can contact a topside of the overhead track 202 (e.g., in the +y domain). In particular, the first and second top rollers 120, 130 can be positioned to define a spacing in between the first and second top rollers 120, 130 on the topside of the overhead track 202 for the supports 204 extending in the +y direction. For example, the first top roller 120 can contact the overhead track 202 at a point in the +y and +z domain, and the second top roller 130 can contact the overhead track 202 at a point in the +y and −z domain.

Referring still to FIG. 2D, the idle roller 110, first top roller 120, and second top roller 130 can rotate about a first axis 112, second axis 122, and third axis 132, respectively. In some implementations, the first, second, and third axes 112, 122, 132 are orthogonal to the x-axis. For example, as shown in FIGS. 2A-2D, the first axis 112 can be in the −y domain, the second and third axes can be in the +y domain, and each of the axes can extend in the +z and −z direction. In particular, the first, second, and third axes 112, 122, 132 can belong to a first plane that is parallel to the y-axis and perpendicular to the x-axis.

Figure 3A:
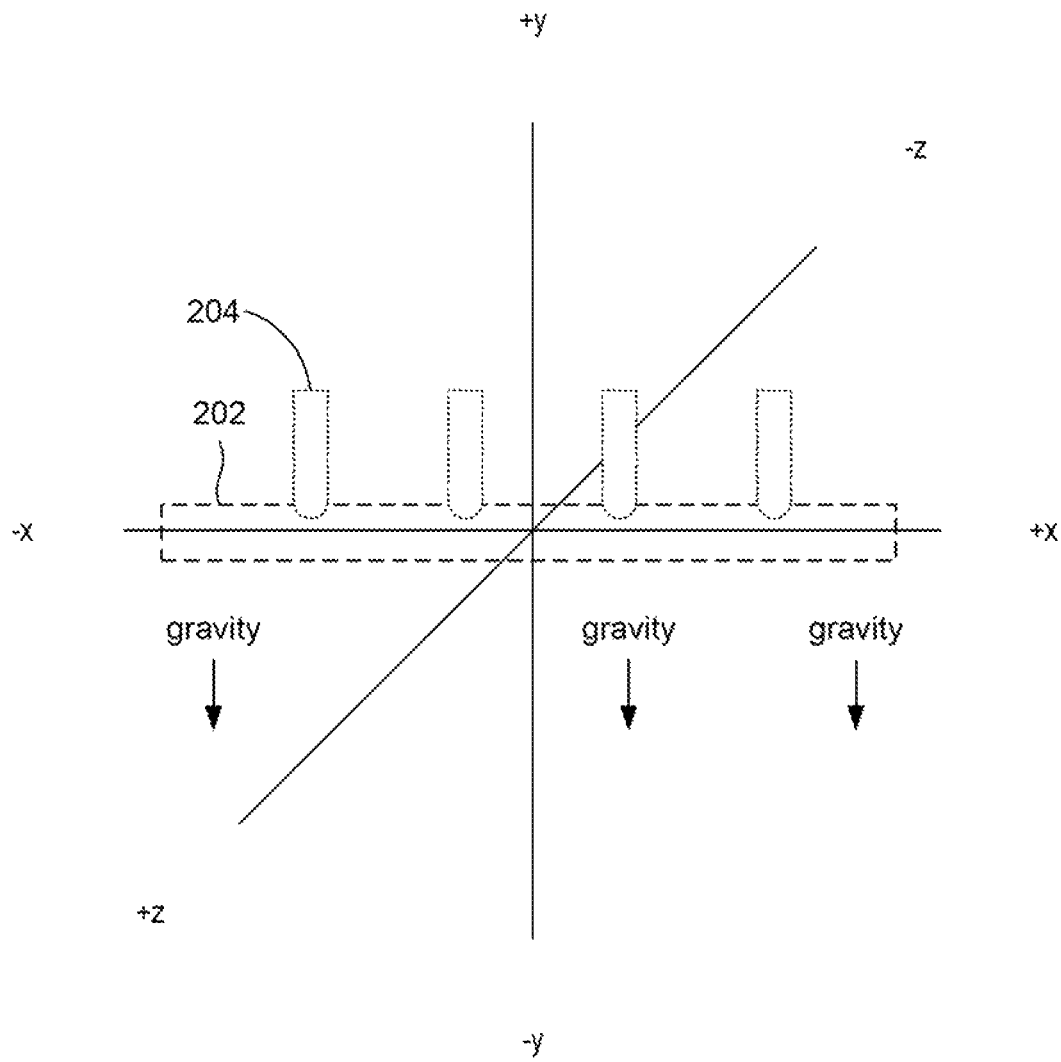
FIGS. 3A-3E depict an overhead track, according to example embodiments of the present disclosure.

FIGS. 3A-3E depict an overhead track 202, according to example embodiments of the present disclosure. As shown in FIG. 3A, the overhead track 202 is supported at periodic intervals by supports 204 extending in the +y direction, and the force of gravity acts in the −y direction.

Figure 3B:
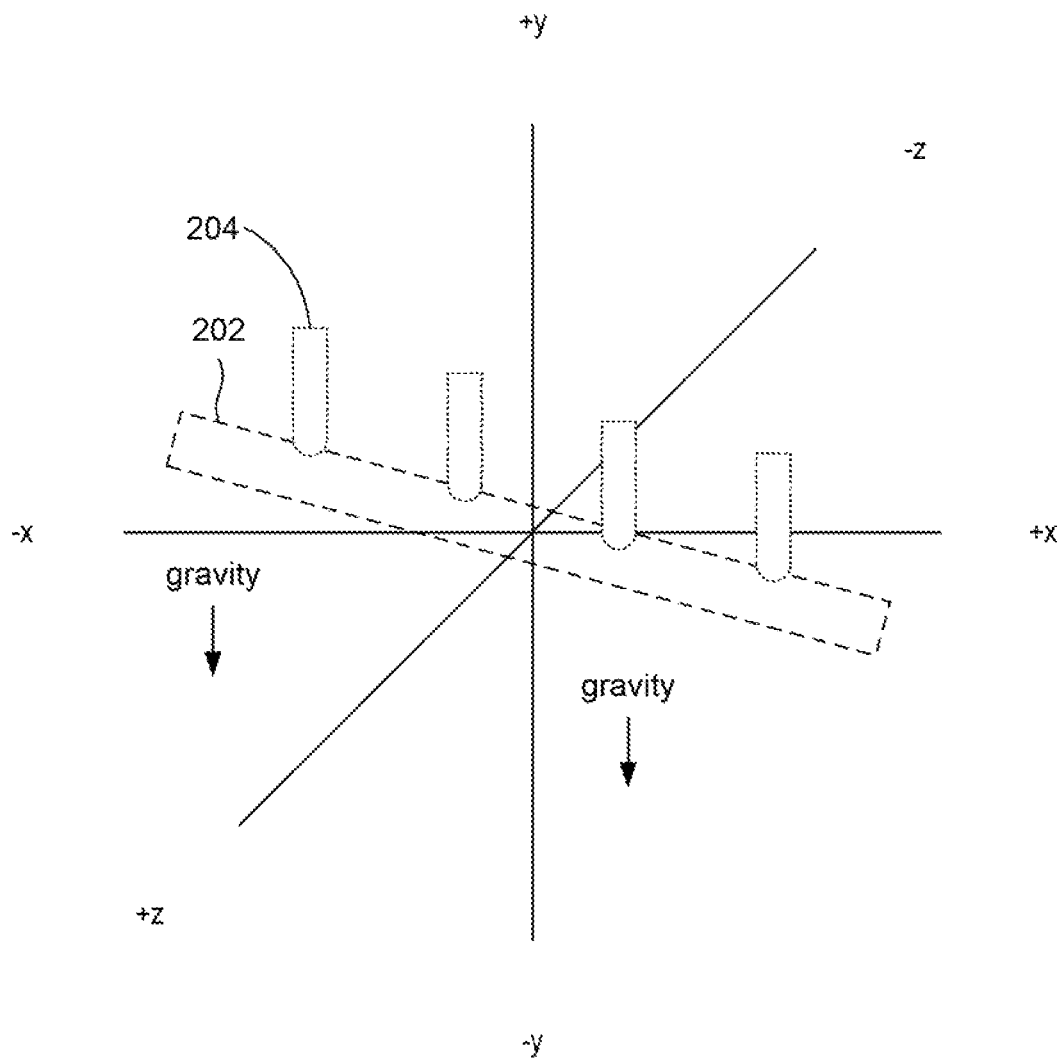
Figure 3C:
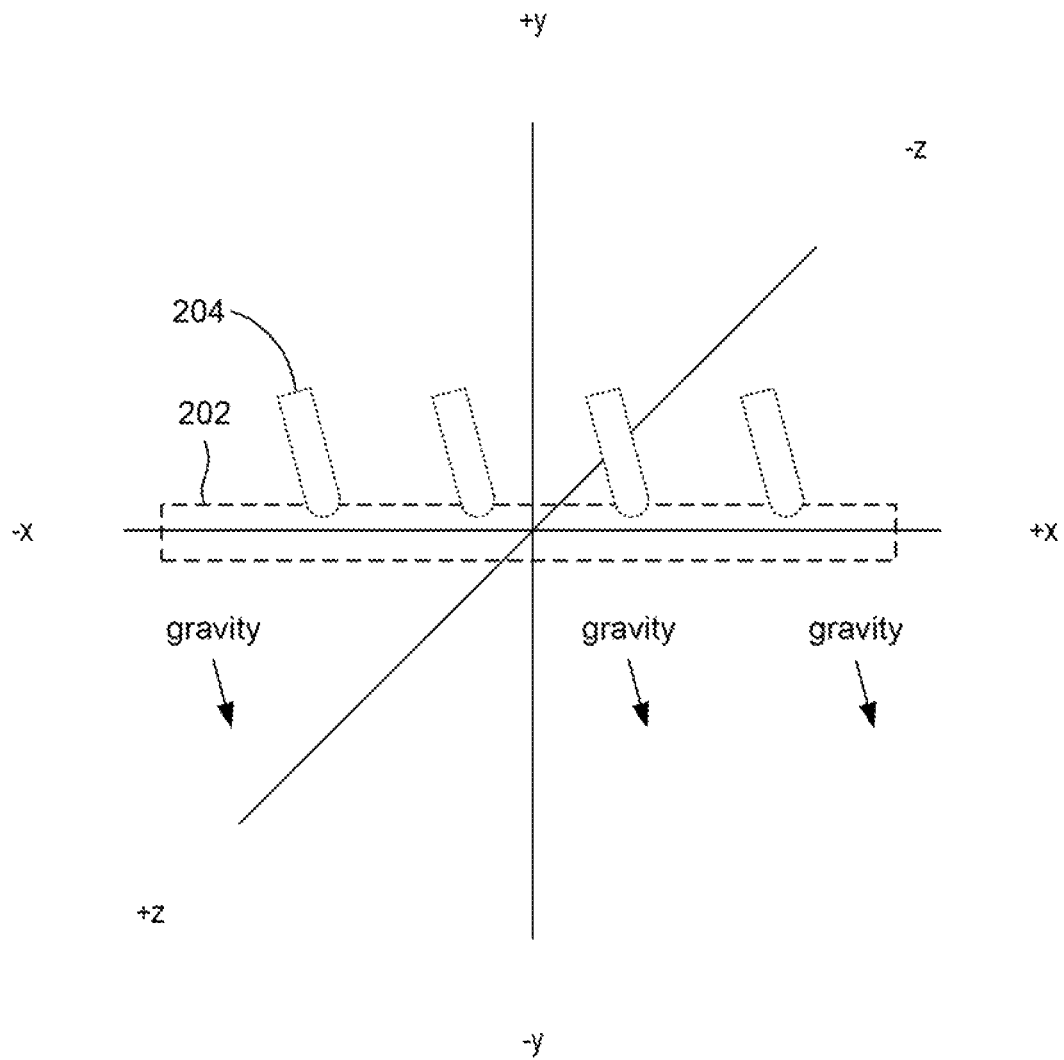
Figure 3D:
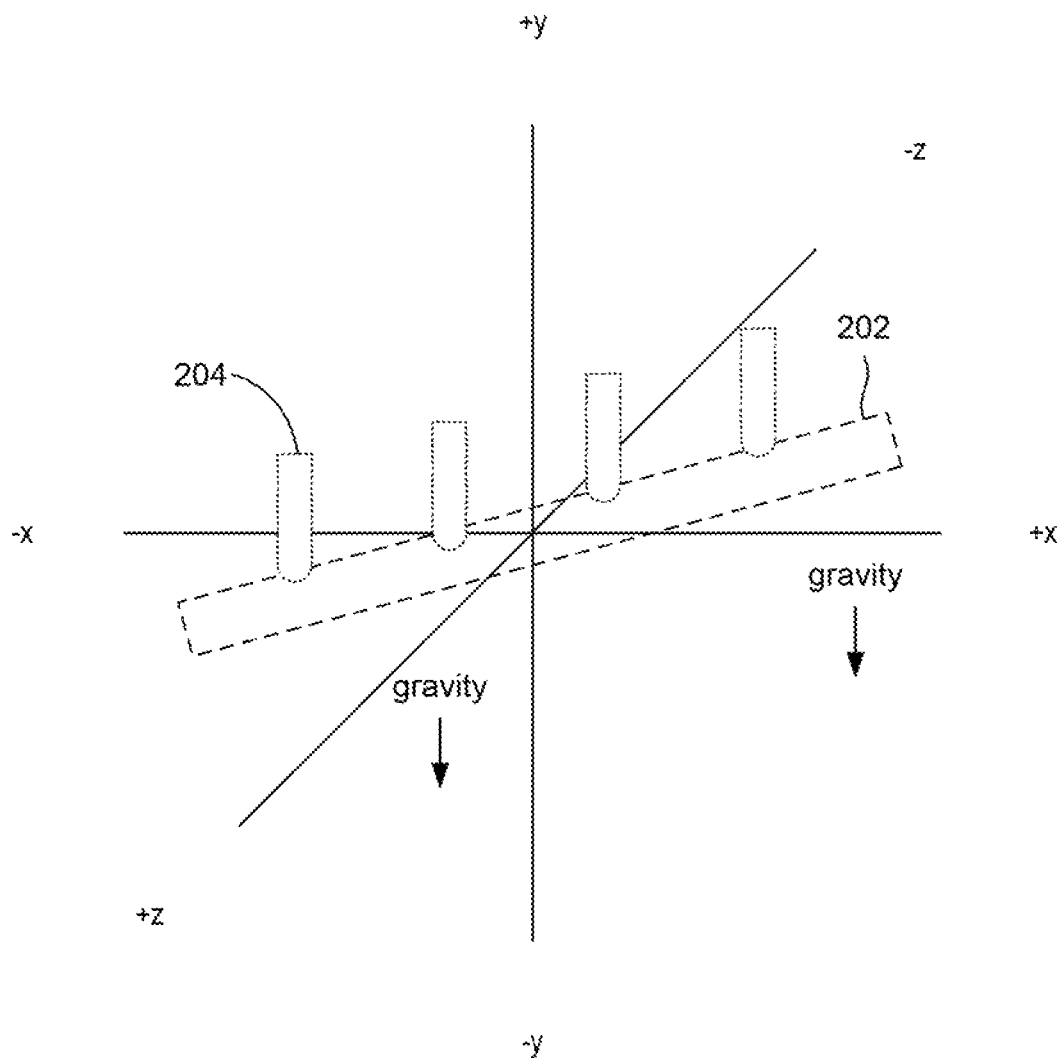
Figure 3E:
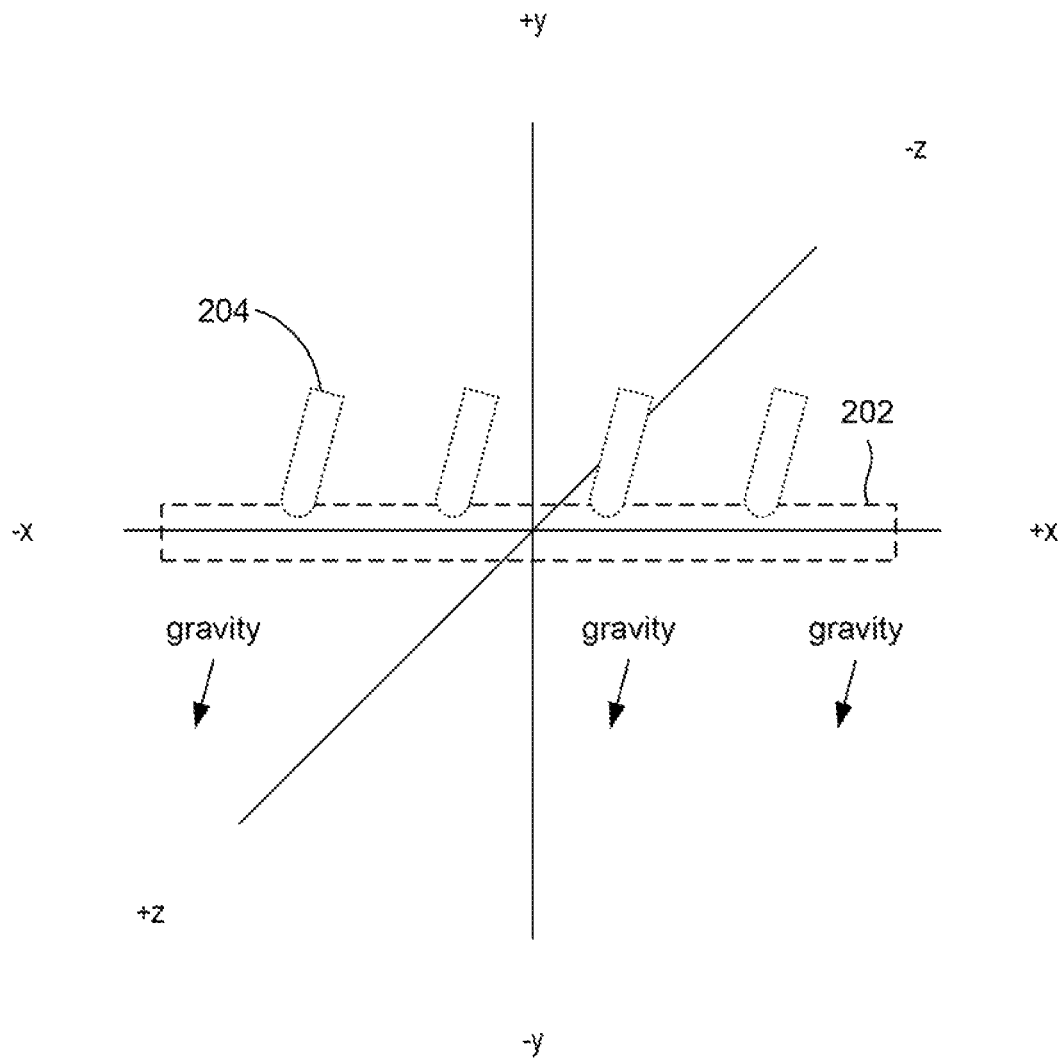

In some implementations, one or more sections of the overhead track 202 can extend at an angle with respect to one or more other sections of the overhead track 202. For example, the overhead track 202 can include turns in the left, right, up, or down directions (e.g., +/−y and/or +/−z). As shown in FIGS. 3B and 3C, the coordinate system can be rotated to align each segment along the x-axis while the direction of the supports and the direction of gravity remain fixed. For example, FIG. 3B depicts a segment of the overhead track 202 extending in a −y direction as it extends in a +x direction. As shown in FIG. 3C, the coordinate system can be rotated to align this segment along the x-axis while the direction of the supports and the direction of gravity remain fixed. As another example, FIG. 3D depicts a segment of the overhead track 202 extending in a +y direction as it extends in a +x direction. As shown in FIG. 3E, the coordinate system can be rotated to align this segment along the x-axis while the direction of the supports and the direction of gravity remain fixed.

Figure 4A:
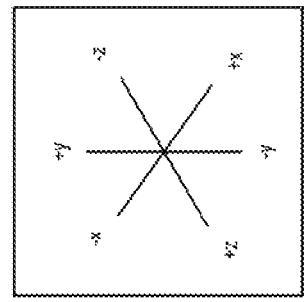
FIGS. 4A-4D depict trolley assembly rollers, according to example embodiments of the present disclosure.
Figure 4A:
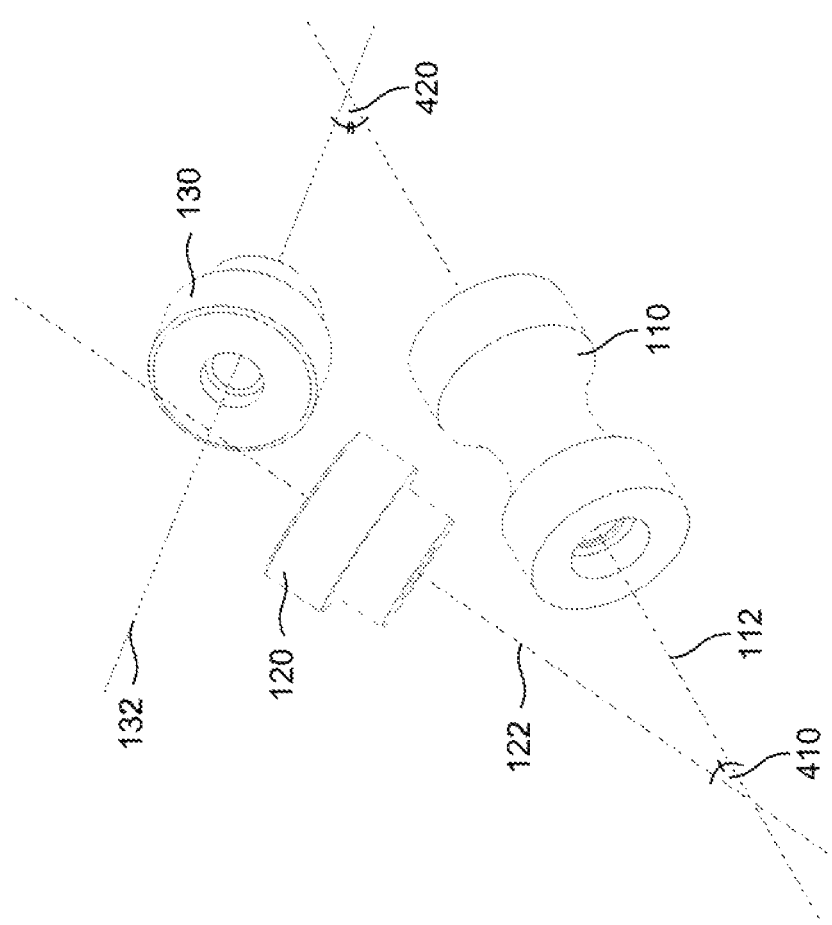

FIGS. 4A-4D depict more particular aspects of trolley assembly rollers, according to example embodiments of the present disclosure. The rollers of the trolley assembly 100 can include idle roller 110, first top roller 120, and second top roller 130. In some implementations, the idle roller 110, first top roller 120, and second top roller 130 can each comprise a generally cylindrical body. In some implementations, the generally cylindrical body can include at least a portion formed with a concave shape. For example, as shown in FIG. 4A, the idle roller 110 can include a generally cylindrical body including a portion formed with a concave shape. In some implementations, the idle roller 110, first top roller 120, and second top roller 130 can be configured to each contact the overhead track 202 at different points to affix the trolley assembly 100 to the track.

Figure 4B:
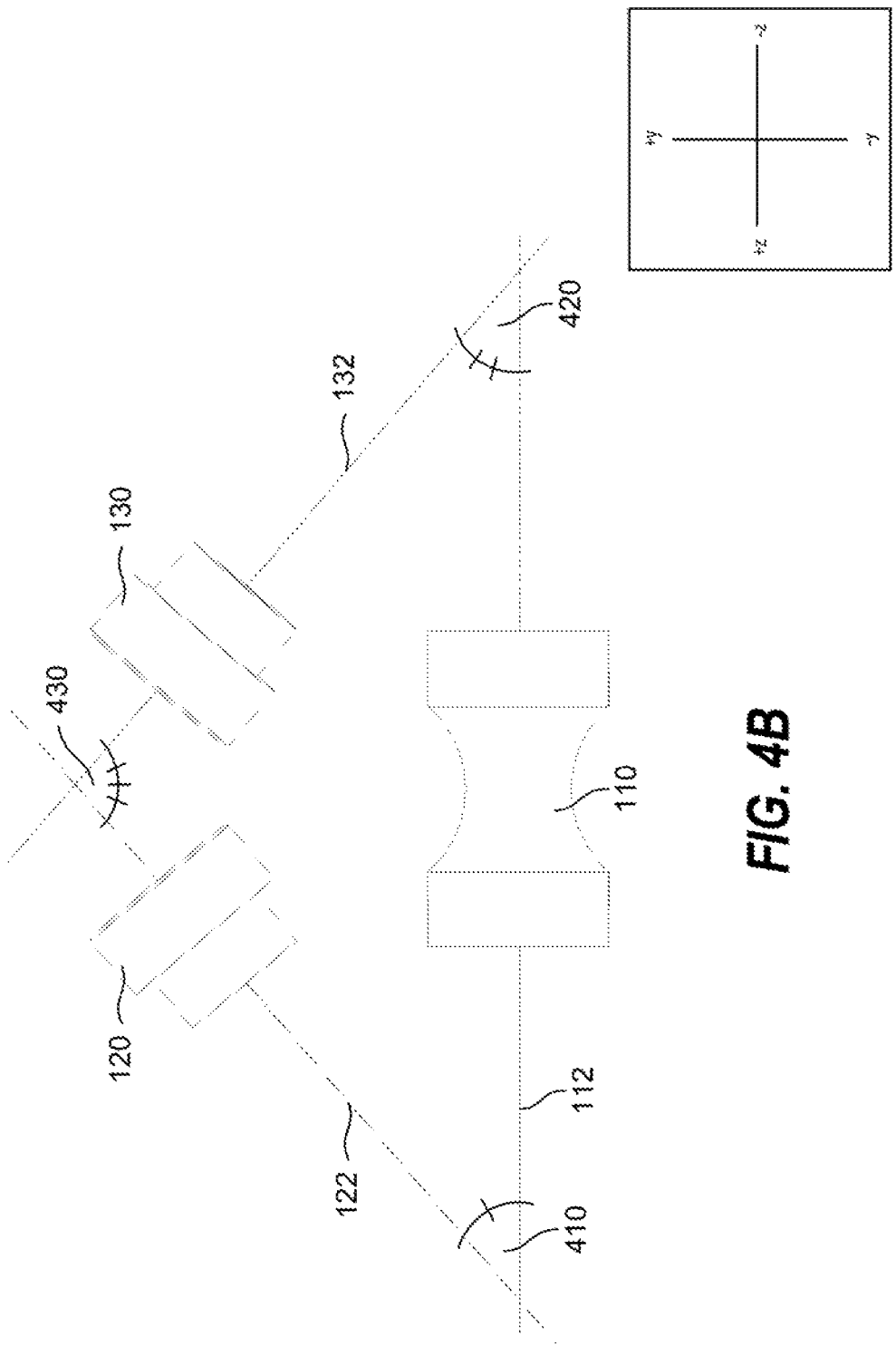

Referring to FIGS. 4A and 4B, the idle roller 110, first top roller 120, and second top roller 130 can rotate about a first axis 112, second axis 122, and third axis 132, respectively. In some implementations, the first, second, and third axes 112, 122, 132 are orthogonal to the x-axis. For example, as shown in FIGS. 4A-4B, the first axis 112 can be in the −y domain, the second and third axes can be in the +y domain, and each of the axes can extend in the +z and −z direction. In particular, the first, second, and third axes 112, 122, 132 can belong to a first plane that is parallel to the y-axis and perpendicular to the x-axis. In some implementations, the first axis 112, second axis 122, and third axis 132 can each belong to different planes. The first and second axis 112, 122 can intersect at a first angle 410; the first and third axis 112, 132 can intersect at a second angle 420; and the second and third axis 122, 132 can intersect at a third angle 430. For example, first axis 112 can have a slope of zero in the +z direction, the second axis 122 can have a positive slope in the +z direction, and the third axis 132 can have a negative slope in the +z direction. In some implementations, the first axis 112, second axis 122, and third axis 132 form a triangle in the first plane. The idle roller 110, first top roller 120, and second top roller 130 can each rotate about its respective axis as the trolley assembly 100 traverses an overhead track in the +x or −x direction.

Figure 4C:
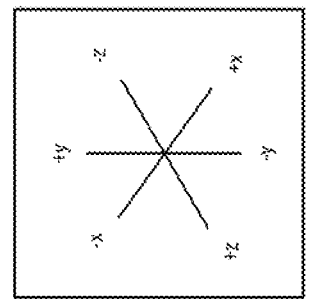
Figure 4C:
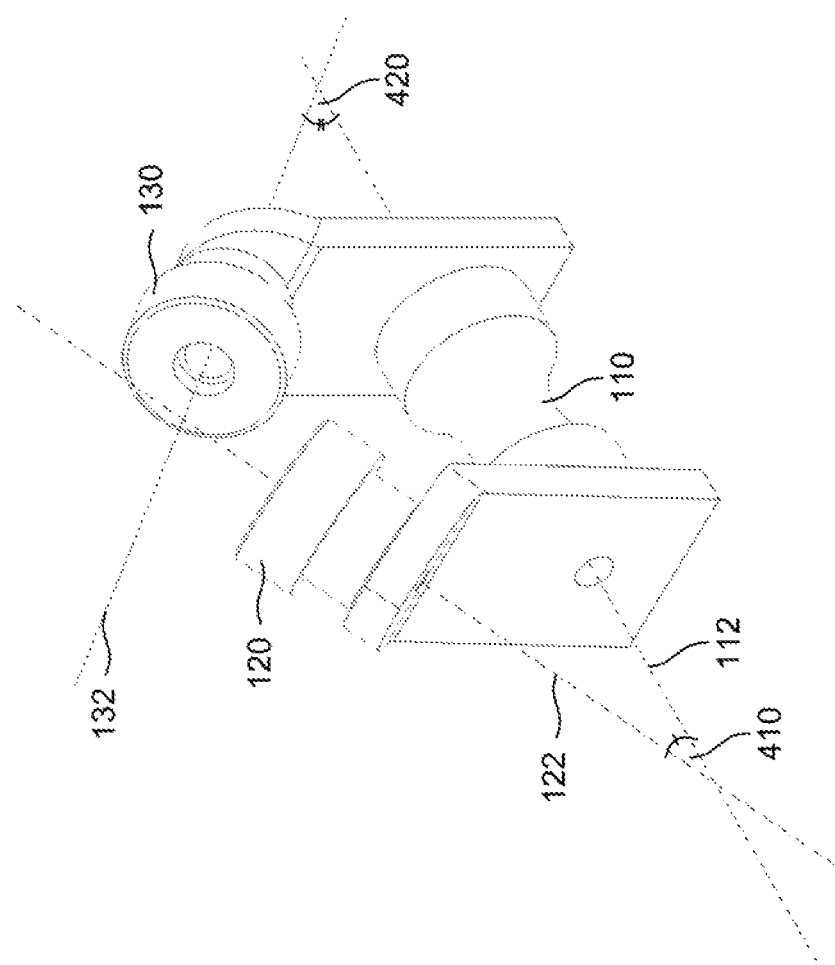
Figure 4D:
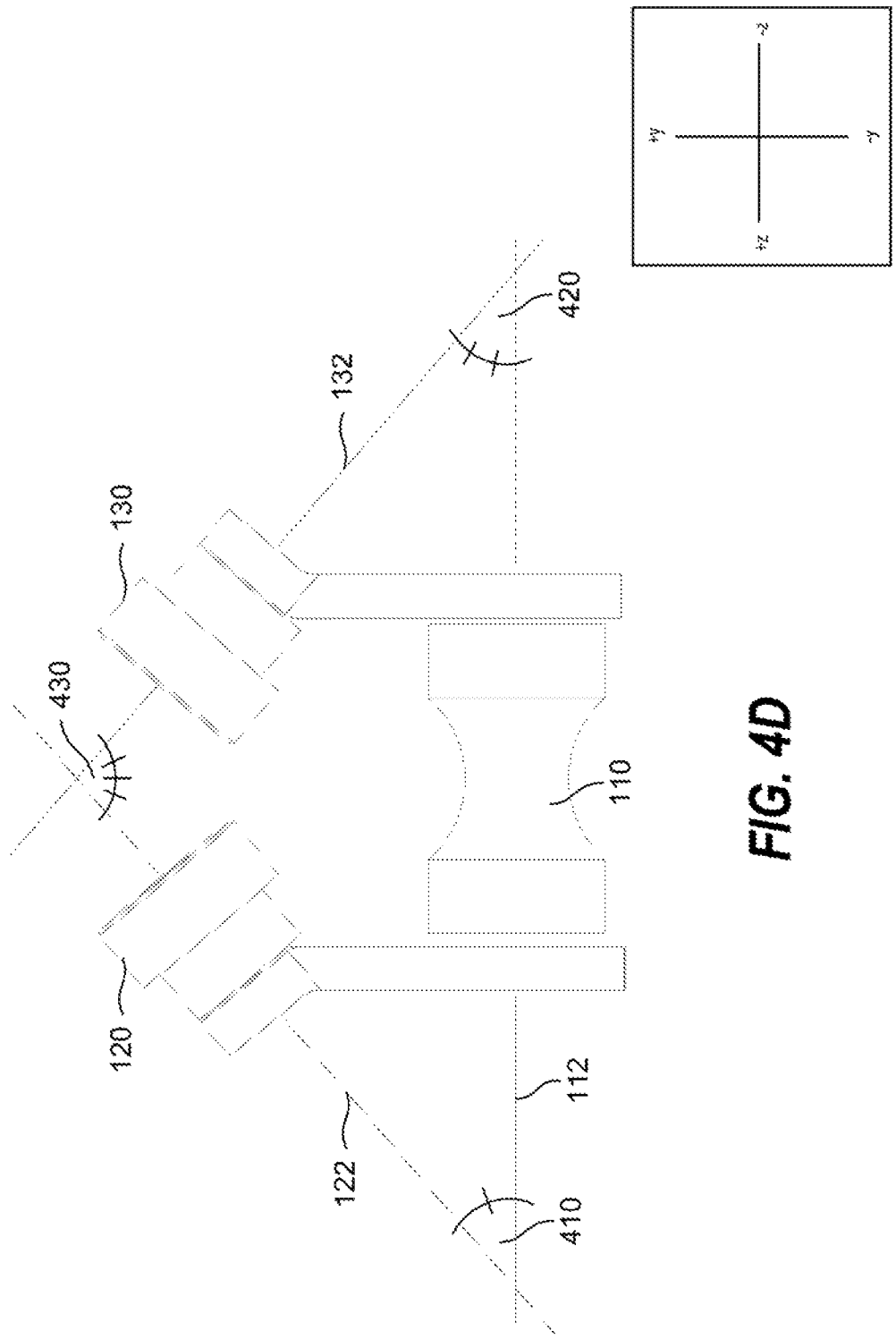

As shown in FIGS. 4C and 4D, the first top roller 120 can be coupled to a first end of the idle roller 110 via a first trolley upright support 124, and the second top roller 130 can be coupled to a second end of the idle roller 110 via a second trolley upright support 134. In this way, a force in the −y direction (e.g., gravity) on the trolley assembly 100 is zeroed by a normal force in the +y direction exerted on the first and second top rollers 120, 130 by the overhead track (e.g., overhead track 202 of FIGS. 2A-2D).

Figure 5A:
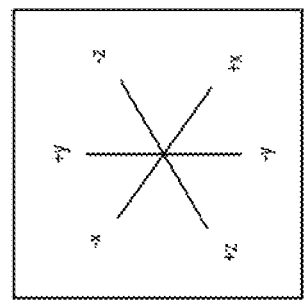
FIGS. 5A-5C depict a trolley assembly cantilever, according to example embodiments of the present disclosure.
Figure 5A:
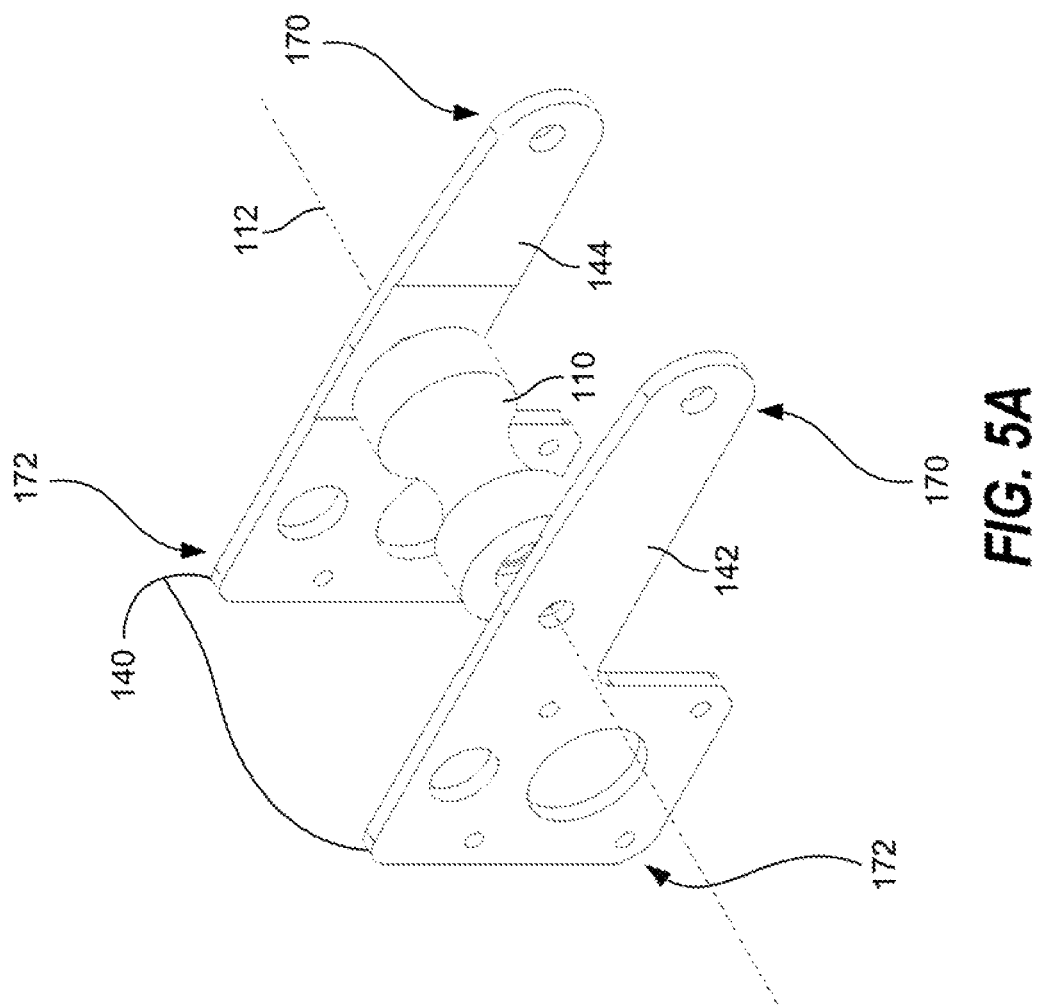
Figure 5B:
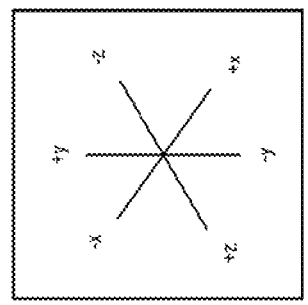
Figure 5B:
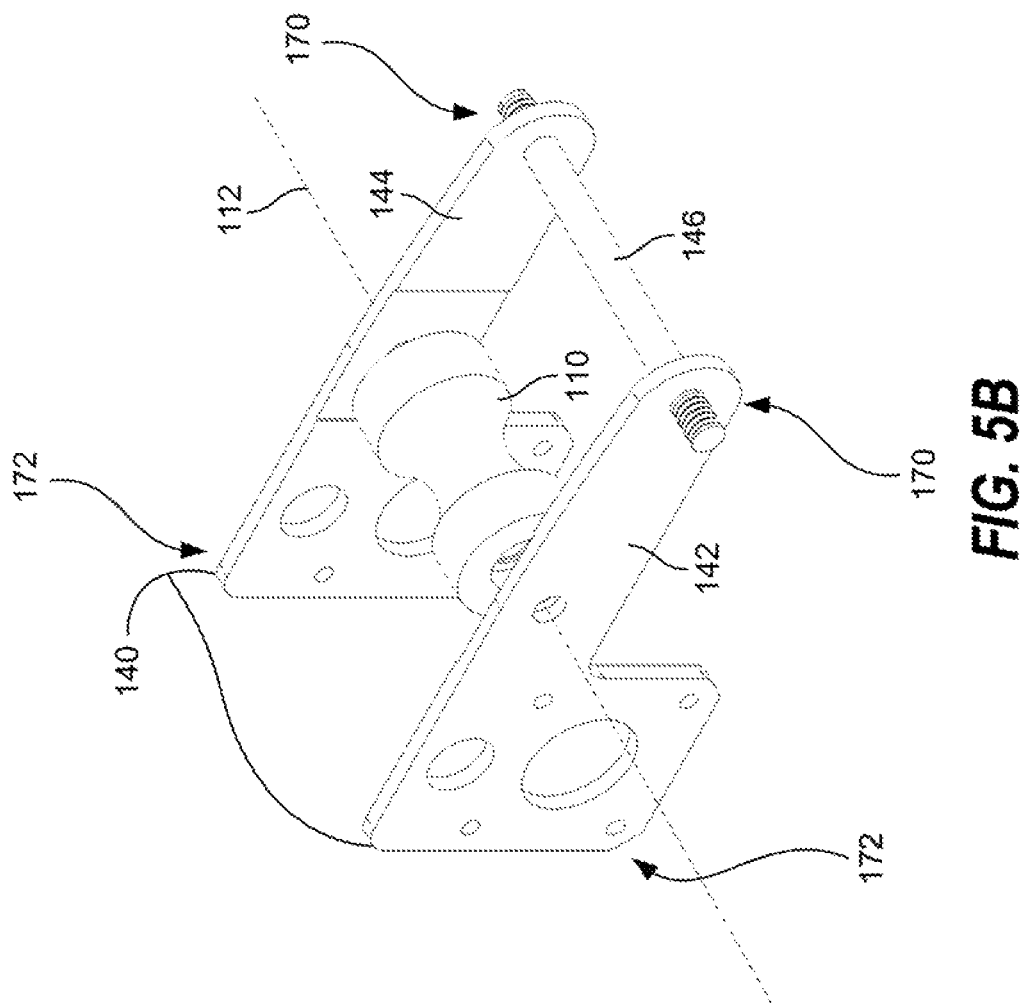
Figure 5C:
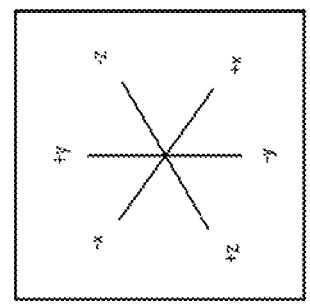
Figure 5C:
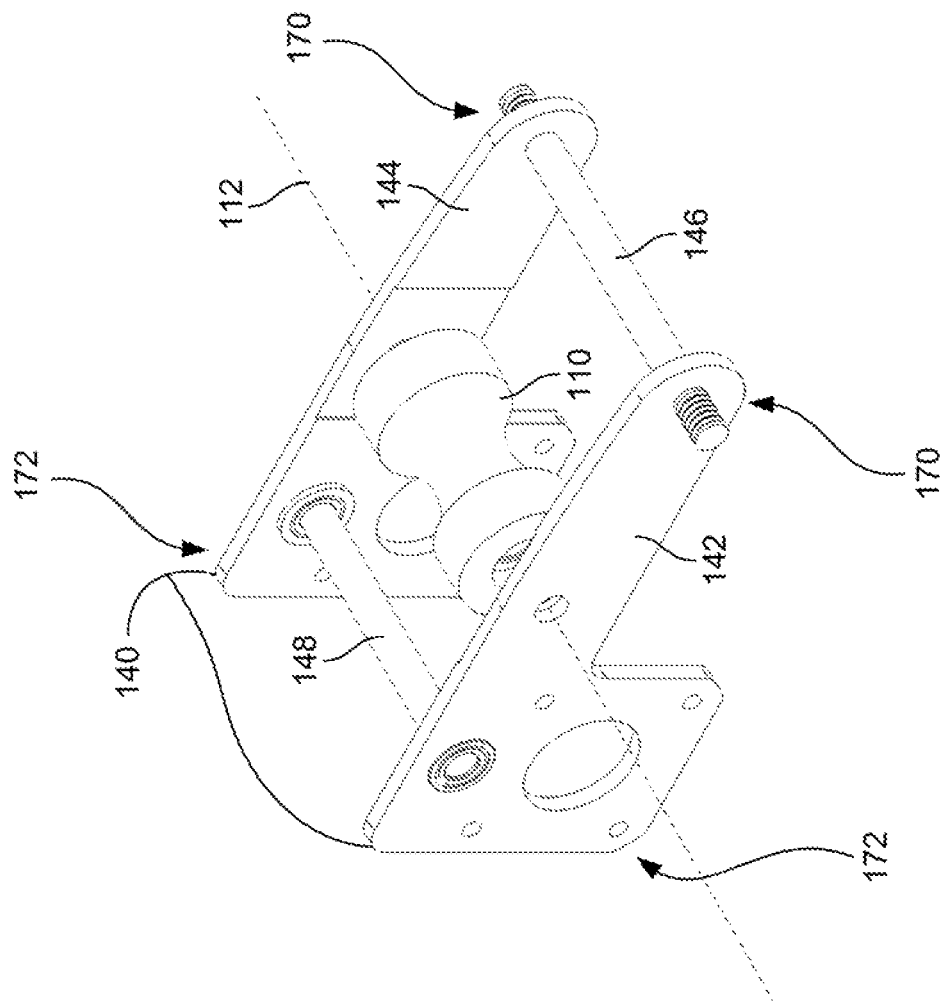

FIGS. 5A-5C depict a trolley assembly cantilever, according to example embodiments of the present disclosure. As shown in FIG. 5A, the cantilever 140 of the trolley assembly 100 can include a first trolley side support 142 coupled to the idle roller 110 and extending along the x-axis. In some implementations, the first trolley side support 142 can itself function as the cantilever 140. In some implementations, the cantilever 140 can include a first and second trolley side support 142, 144 coupled to a first and second end of the idle roller 110, respectively. In some implementations, first trolley side support 142 can rotate about the first axis 112 at the first end of the idle roller 110, and the second trolley side support 144 can rotate about the first axis 112 at the second end of the idle roller 110. In some implementations, the first and second trolley side supports 142, 144 can be coupled to each other so that they rotate together about the first axis 112. For example, as shown in FIG. 5B, the first and second trolley side supports 142, 144 can be coupled by first a cantilever support 146 that is parallel to the first axis 112 and extends between the first trolley side support 142 and the second trolley side support 144. As another example, as shown in FIG. 5C, the first and second trolley side supports 142, 144 can be coupled by the first cantilever support 146 on a first end 170 of the cantilever 140, and coupled by a second cantilever support 148 on a second end 172 of the cantilever 140. In some embodiments, a connector (e.g., connector 174 of FIG. 2A) can include a hook or other device for attaching to the first cantilever support 146 and supporting a test object (e.g., test object 220 of FIG. 2A).

Figure 6:
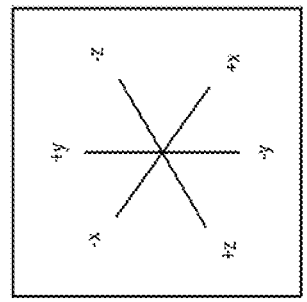
FIG. 6 depicts a trolley assembly driveshaft, according to example embodiments of the present disclosure.
Figure 6:
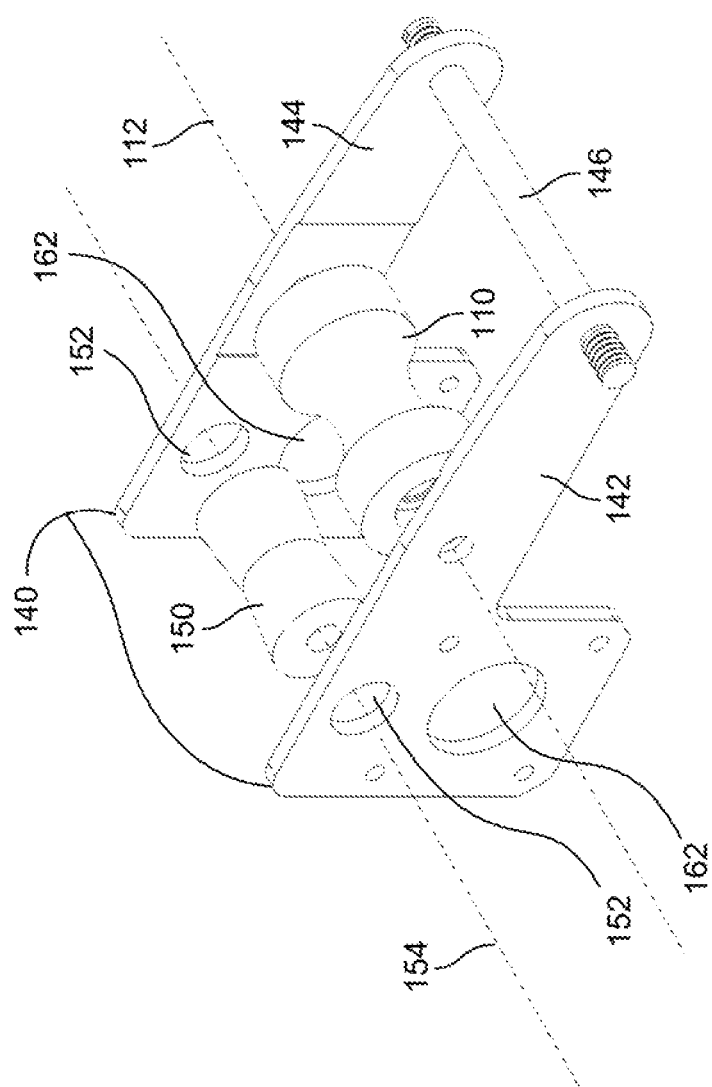

FIG. 6 depicts a trolley assembly driveshaft, according to example embodiments of the present disclosure. As shown in FIG. 6, the second end 172 of the cantilever 140 can include a driveshaft-housing 152 for a driveshaft 150 and a motor-housing 162 for a motor 160. The driveshaft 150 of the trolley assembly 100 can be positioned in the driveshaft-housing 152 at the second end 172 of the cantilever 140, and configured to rotate about the fourth axis 154. In some implementations, the driveshaft 150 can surround the second cantilever support (e.g., second cantilever support 148 of FIG. 5C). When the driveshaft 150 is in contact with an overhead track (e.g., overhead track 202 of FIGS. 2A-2D), a rotation of the driveshaft 150 about the fourth axis 154 causes the trolley assembly 100 to traverse the overhead track. A trolley assembly can traverse an overhead track in a direction that corresponds to a direction of rotation of the driveshaft 150. In some implementations, the fourth axis 154 is parallel to the first axis 112.

Referring still to FIG. 6 and also to FIGS. 2A-2D, when the cantilever 140 rotates about the first axis 112 between the first cantilever position 210 and second cantilever position 212, the fourth axis 154 also rotates about the first axis 112 between a first and second position, respectively. For example when the cantilever 140 is in the first cantilever position 210, the fourth axis 154 is a first distance from the overhead track 202 such that the driveshaft 150 is not in contact with the overhead track 202. In this case, a rotation of the driveshaft 150 about the fourth axis 154 does not cause the trolley assembly 100 to traverse the overhead track 202. When the cantilever 140 is in the second cantilever position 212, the fourth axis 154 is a second distance from the overhead track 202 such that the driveshaft 150 is in contact with the overhead track 202. In this case, a rotation of the driveshaft 150 about the fourth axis 154 causes the trolley assembly 100 to traverse the overhead track 202.

Figure 7A:
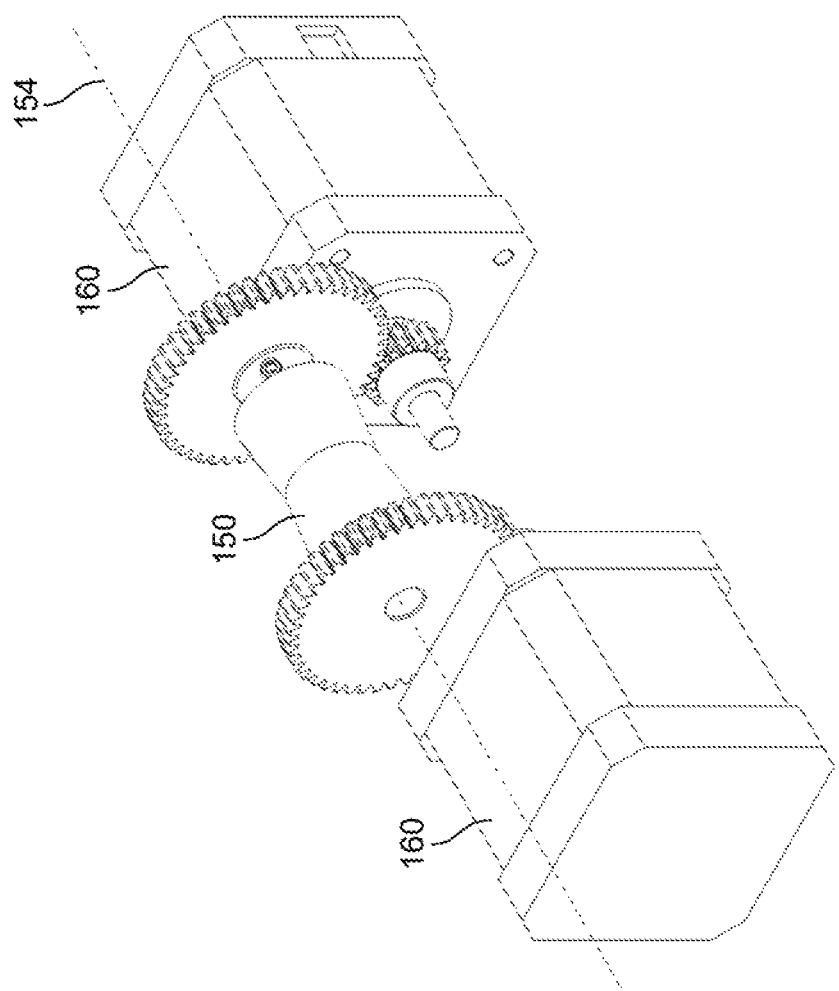
FIGS. 7A-7B depict a trolley assembly driveshaft and motors, according to example embodiments of the present disclosure.
Figure 7A:
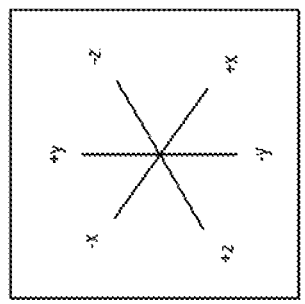
Figure 7B:
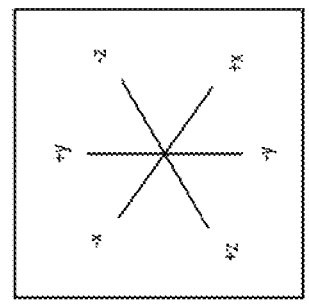
Figure 7B:
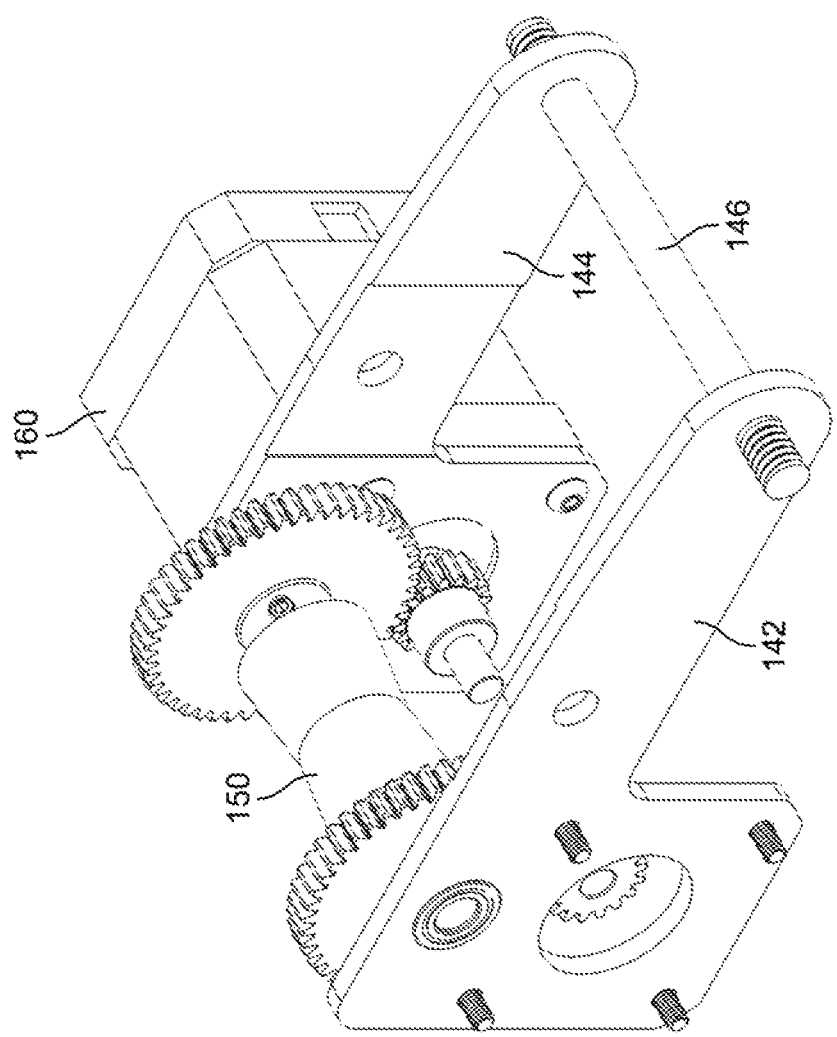
Figure 8:
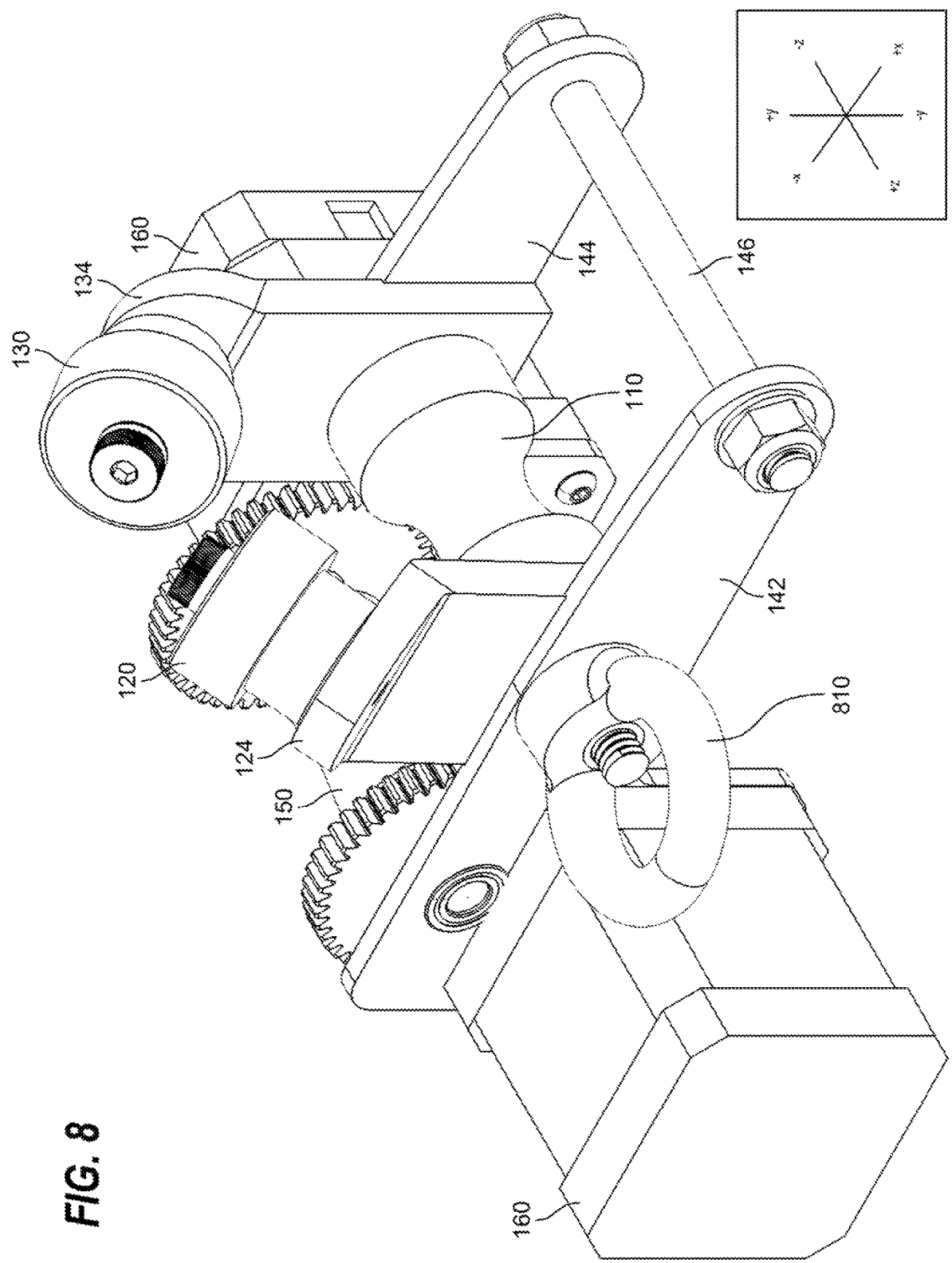
FIG. 8 depicts a trolley assembly, according to example embodiments of the present disclosure.

FIGS. 7A-7B depict a trolley assembly driveshaft and motor(s), according to example embodiments of the present disclosure. In some implementations, the trolley assembly 100 can include one motor, and in other implementations, the trolley assembly 100 can include multiple motors. For example, as shown in FIG. 1, the trolley assembly 100 can include motor 160. As another example, as shown in FIG. 7A and FIG. 8, the trolley assembly 100 can include two motors 160. The motor(s) can be coupled to a first end of the driveshaft 150 and/or a second end of the driveshaft 150. The motor(s) 160 of the trolley assembly 100 can be configured to rotate the driveshaft 150 about the fourth axis 154 and cause the trolley assembly 100 to traverse an overhead track (e.g., overhead track 202 of FIGS. 2A-2D) in a direction corresponding to the rotation. In some implementations, the motor(s) 160 can be housed at the second end 172 of the cantilever 140, near the driveshaft, in the motor housing 162.

FIG. 8 depicts a trolley assembly, according to example embodiments of the present disclosure. As shown in FIG. 8, the trolley assembly 100 includes a cable manager 810. The cable manager 810 can be used to route one or more cable(s) to power the motor(s) 160, so that the cable(s) do not interfere with a traversal of the trolley assembly 100 on the overhead track 202. As further shown in FIG. 8, the first trolley side support 142 of the cantilever 140 can be coupled to the first trolley upright support 124, and the second trolley side support 144 can be coupled to the second trolley upright support 134.

Figure 9:
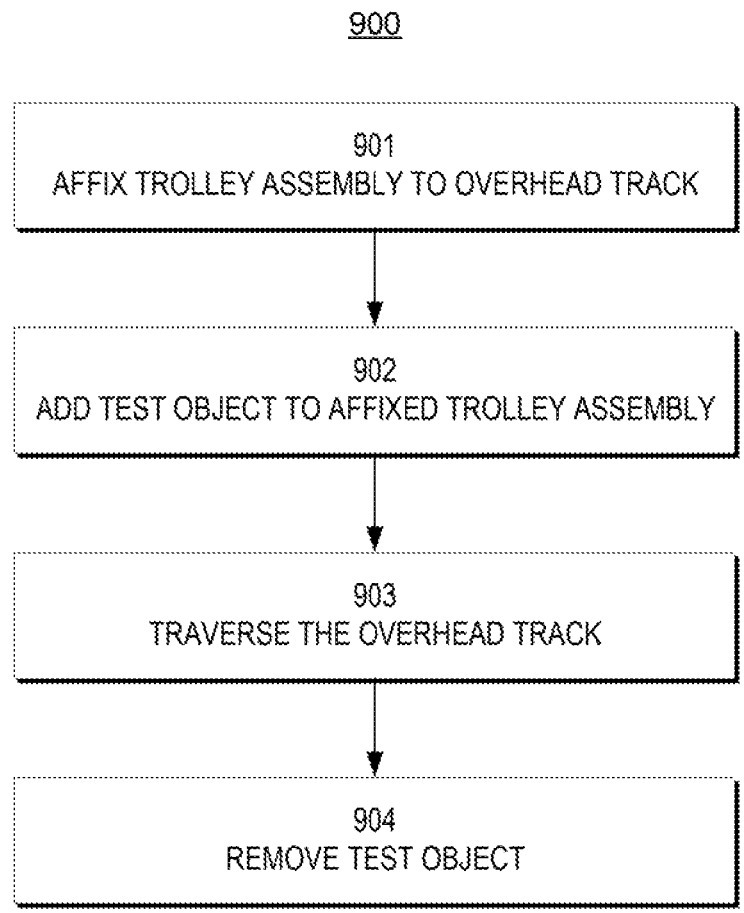
FIG. 9 depicts a flow diagram of traversing an overhead track with a trolley assembly, according to example embodiments of the present disclosure.

FIG. 9 depicts a flow diagram of an example method 900 of traversing an overhead track with a trolley assembly, according to example embodiments of the present disclosure. FIG. 9 depicts elements performed in a particular order for purposes of illustration and discussion. Those of ordinary skill in the art, using the disclosures provided herein, will understand that the elements of any of the methods (e.g., method 900 of FIG. 9) discussed herein can be adapted, rearranged, expanded, omitted, combined, and/or modified in various ways without deviating from the scope of the present disclosure.

At (901), the method 900 can include affixing a trolley assembly to an overhead track. For example, the trolley assembly 100 can be affixed to the overhead track 202. In some implementations, a trolley assembly 100 can include a cantilever and a driveshaft coupled to an end of the cantilever. For example, the trolley assembly 100 can include the cantilever 140 and the driveshaft 150 coupled to a second end 172 of the cantilever 140. In some implementations, a trolley assembly can be removably affixed to an overhead track. For example, the trolley assembly 100 can be removably affixed to the overhead track 202. In some implementations, a position of the trolley assembly on the overhead track can be adjusted by manual operation. For example, the trolley assembly 100 can be affixed at one or more positions (e.g., position 206, 208), and the position of the trolley assembly 100 can be adjusted by manual operation.

At (902), the method 900 can include adding a test object to an affixed trolley assembly. For example, the test object 220 can be added to the trolley assembly 100 at a first end of the cantilever 140. The test object 220 exerts a force on the first end of the cantilever 140 so that the cantilever 140 rotates about a first axis 112 to a second position 212, causing the driveshaft 150 coupled to the second end of the cantilever 140 to contact the overhead track 202. The first axis 112 can be positioned between the first and second ends of the cantilever 140, and the first axis can be orthogonal to a traversing direction of the trolley assembly along the overhead track.

At (903), the method 900 can include traversing the overhead track. For example, the motor(s) 160 of the trolley assembly 100 can cause the driveshaft 150 to rotate about a second axis (e.g., fourth axis 154) parallel to the first axis 112. Rotating the driveshaft 150 while it is in contact with the overhead track 202 causes the trolley assembly 100 to traverse the overhead track. The trolley assembly 100 can avoid one or more supports 204 while traversing the overhead track 202.

At (904), the method 900 can include removing the test object from the trolley assembly. For example, the test object 220 can be removed from the trolley assembly 100, removing a force on the first end of the cantilever 140 so that the cantilever 140 rotates about the first axis 112 to a first position 210, causing the driveshaft 150 to lose contact with the overhead track 202. In this way, the trolley assembly 100 can be more easily removed from the overhead track 202.

While the present subject matter has been described in detail with respect to specific example embodiments and methods thereof, it will be appreciated that those skilled in the art, upon attaining an understanding of the foregoing can readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A trolley assembly comprising:

an idle roller that rotates about a first axis;

a first top roller coupled to a first end of the idle roller via a first trolley upright support, wherein the first top roller rotates about a second axis, the second axis offset at a first angle with respect to the first axis;

a second top roller coupled to a second end of the idle roller via a second trolley upright support, wherein the second top roller rotates about a third axis, the third axis offset at a second angle with respect to the first axis;

a cantilever coupled to the idle roller, wherein the cantilever rotates about the first axis;

a driveshaft coupled to a second end of the cantilever, wherein the driveshaft rotates about a fourth axis parallel to the first axis, and the fourth axis rotates about the first axis; and at least one motor coupled to the driveshaft, wherein the motor causes the driveshaft to rotate about the fourth axis, wherein the fourth axis rotates about the first axis between a first cantilever position and a second cantilever position, wherein a distance between the driveshaft and the overhead track changes when the fourth axis rotates about the first axis, wherein when the fourth axis is at the second cantilever position, the driveshaft is in contact with the overhead track, and wherein when the fourth axis is at the second cantilever position, a rotation of the driveshaft about the fourth axis causes the trolley assembly to traverse the overhead track.

2. The trolley assembly of claim 1, wherein the second axis and the third axis intersect.

3. The trolley assembly of claim 2, wherein the first, second, and third axes form a triangle in a first plane.

4. The trolley assembly of claim 1, wherein the idle roller, first top roller, and second top roller are in contact with an overhead track.

5. The trolley assembly of claim 1, wherein a first end of the first top roller is coupled to the first end of the idle roller, a first end of the second top roller is coupled to the second end of the idle roller, and the first and second top rollers are positioned to define a spacing in between a second end of the first top roller and a second end of the second top roller such that overhead track supports can be avoided by passing through the spacing while the trolley assembly traverses an overhead track.

6. The trolley assembly of claim 1, wherein the idle roller comprises a cylindrical body having at least a portion of which is formed with a concave shape.

7. The trolley assembly of claim 1, wherein a first motor is coupled to a first end of the driveshaft and a second motor is coupled to a second end of the driveshaft.

8. The trolley assembly of claim 1, wherein the cantilever comprises a first trolley side support coupled to the first end of the idle roller, and a second trolley side support that is parallel to the first trolley side support and coupled to the second end of the idle roller.

9. A method of traversing an overhead track with a trolley assembly, the method comprising:

affixing a trolley assembly to an overhead track, the trolley assembly including a cantilever, a driveshaft coupled to a second end of the cantilever, and an idle roller that rotates about a first axis, the cantilever coupled to the idle roller;

adding a force to a first end of the cantilever so that the cantilever rotates about the first axis to a second position, causing the driveshaft coupled to the second end of the cantilever to contact the overhead track, wherein the first axis is positioned between the first and second ends of the cantilever, and the first axis is orthogonal to a traversing direction of the trolley assembly along the overhead track;

rotating the driveshaft about a second axis parallel to the first axis, wherein rotating the driveshaft while the driveshaft is in contact with the overhead track causes the trolley assembly to traverse the overhead track;

removing the force to the first end of the cantilever so that the cantilever rotates about the first axis from the first position, causing the driveshaft to lose contact with the overhead track; and adjusting a position of the trolley assembly on the overhead track by a manual operation.

10. The method of claim 9, wherein the trolley assembly is removably affixed to the overhead track.

11. The method of claim 9, wherein the driveshaft is in contact with the overhead track if the cantilever is in a second position.

12. The method of claim 9, further comprising:

avoiding one or more supports of the overhead track while traversing the overhead track.

13. The method of claim 9, further comprising:

driving a motor to rotate the driveshaft about the second axis.

14. A trolley assembly, comprising:

an idle roller comprising a generally cylindrical body and configured to contact an overhead track at a first point on an underside of the overhead track to affix the trolley assembly to the overhead track;

a first top roller comprising a generally cylindrical body and configured to contact the overhead track at a second point on a topside of the overhead track to affix the trolley assembly to the overhead track;

a second top roller comprising a generally cylindrical body and configured to contact the overhead track at a third point on the topside of the overhead track to affix the trolley assembly to the overhead track, wherein the first and second top rollers are configured to define a spacing in between the first and second top rollers on the topside of the overhead track through which one or more supports of the overhead track pass as the trolley assembly traverses the overhead track, a cantilever coupled to the idle roller, wherein the cantilever is rotatable about the first axis; and a driveshaft coupled to a second end of the cantilever, wherein the driveshaft is rotatable about a fourth axis parallel to the first axis, and the fourth axis rotates about the first axis, wherein the fourth axis rotates about the first axis between a first cantilever position and a second cantilever position, wherein a distance between the driveshaft and the overhead track changes when the fourth axis rotates about the first axis, wherein when the fourth axis is at the second cantilever position, the driveshaft is in contact with the overhead track, and wherein when the fourth axis is at the second cantilever position, a rotation of the driveshaft about the fourth axis causes the trolley assembly to traverse the overhead track.

* * * * *